(12) United States Patent
Macris

(10) Patent No.: US 6,727,422 B2
(45) Date of Patent: Apr. 27, 2004

(54) HEAT SINK/HEAT SPREADER STRUCTURES AND METHODS OF MANUFACTURE

(76) Inventor: Chris Macris, P.O. Box 2660, North Bend, WA (US) 98045

( * ) Notice: Subject to any disclaimer, the term of this patent is extended or adjusted under 35 U.S.C. 154(b) by 81 days.

(21) Appl. No.: 09/927,331

(22) Filed: Aug. 10, 2001

(65) Prior Publication Data

US 2002/0063330 A1 May 30, 2002

Related U.S. Application Data

(63) Continuation-in-part of application No. 09/664,121, filed on Sep. 18, 2000.

(51) Int. Cl.$^7$ ............... H01L 35/34; H01L 23/34; H01L 21/50; H01L 21/46; F25B 21/02
(52) U.S. Cl. ............... 136/201; 136/204; 136/205; 62/3.2; 257/713; 257/717; 257/930; 438/54; 438/118; 438/455; 438/458; 438/460
(58) Field of Search ............................. 136/204, 203, 136/200, 201, 205, 242; 62/3.2; 257/930, 712, 713, 717, 718, 719, 722; 438/118, 54, 55, 48, 22, 458, 460, 106, 455, 107

(56) References Cited

U.S. PATENT DOCUMENTS

| | | |
|---|---|---|
| 3,097,027 A * | 7/1963 | Mims et al. ............... 384/476 |
| 4,092,614 A | 5/1978 | Sakuma et al. |
| 4,211,888 A | 7/1980 | Stein et al. |
| 5,022,928 A * | 6/1991 | Buist ............... 136/212 |
| 5,051,865 A | 9/1991 | Kato |
| 5,061,987 A | 10/1991 | Hsia |
| 5,229,327 A | 7/1993 | Farnworth |
| 5,598,031 A | 1/1997 | Groover et al. |
| 5,714,791 A | 2/1998 | Chi et al. |
| 5,724,818 A * | 3/1998 | Iwata et al. ............... 62/3.7 |
| 5,793,107 A | 8/1998 | Nowak |
| 5,837,929 A | 11/1998 | Adelman |
| 5,956,569 A | 9/1999 | Shiu et al. |
| 6,080,608 A | 6/2000 | Nowak |
| 6,121,661 A | 9/2000 | Assaderaghi et al. |
| 6,162,659 A | 12/2000 | Wu |
| 6,166,411 A | 12/2000 | Buynoski |
| 6,196,002 B1 * | 3/2001 | Newman et al. ............... 62/3.7 |

* cited by examiner

Primary Examiner—Patrick Ryan
Assistant Examiner—Thomas H. Parsons
(74) Attorney, Agent, or Firm—Jensen & Puntigam, P.S.

(57) ABSTRACT

A heat sink/heat spreader structure utilizing thermoelectric effects to efficiently transport thermal energy from a variety of heat sources including integrated circuits and other electronic components. A method for manufacturing the heat sink/spreader is also disclosed.

71 Claims, 14 Drawing Sheets

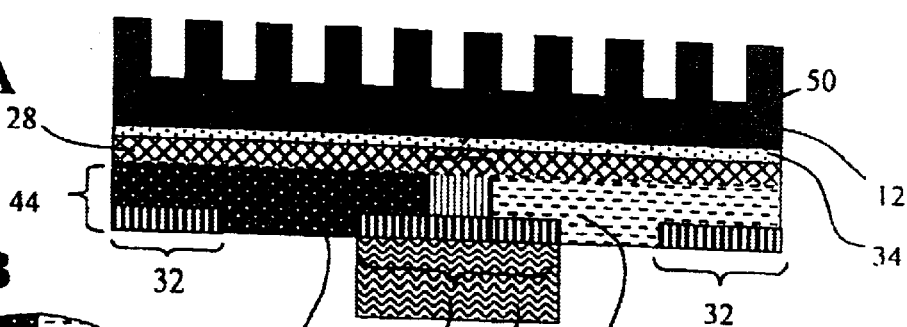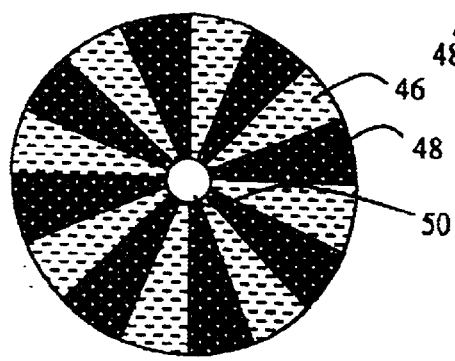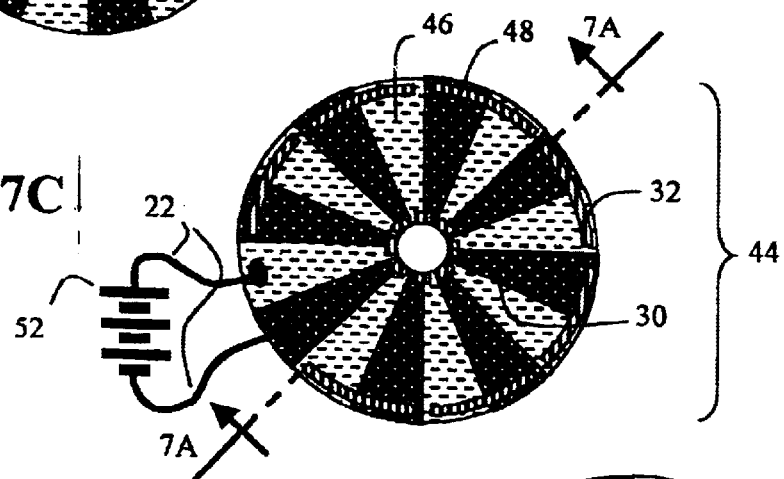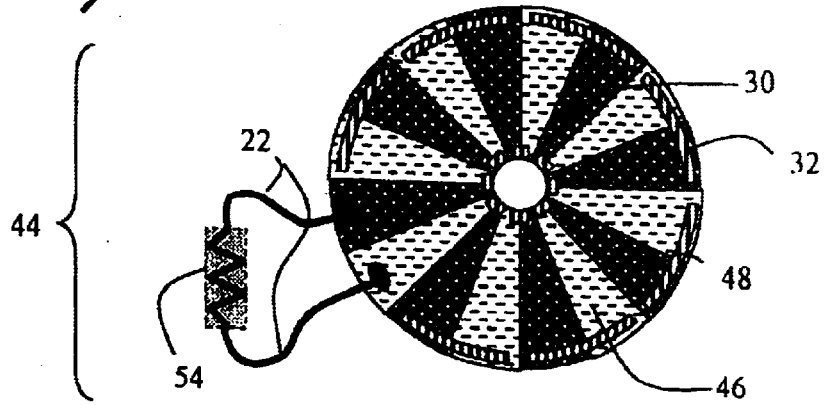

FIG. 16B
FIG. 16C
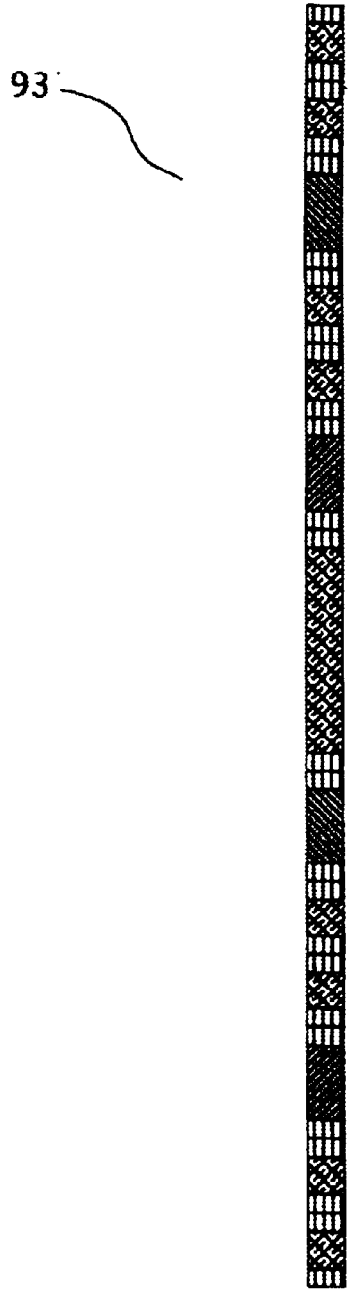
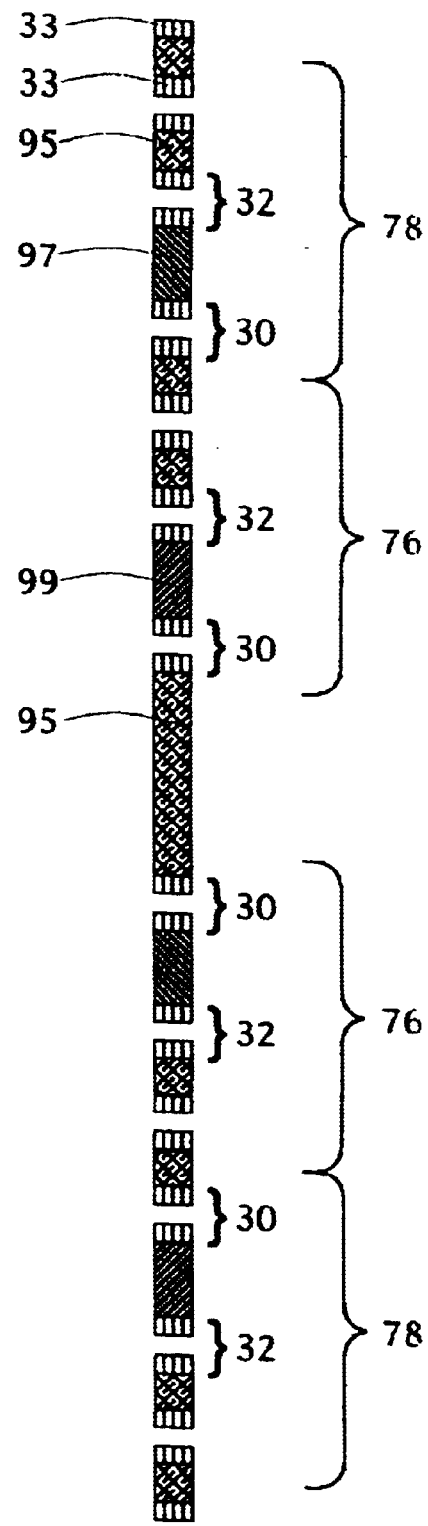

HEAT SINK/HEAT SPREADER STRUCTURES AND METHODS OF MANUFACTURE

CROSS-REFERENCE TO RELATED APPLICATIONS

The present application is a continuation-in-part of, and claims priority from, U.S. Patent application Ser. No. 09/664,121 filed Sep. 18, 2000, and still pending.

BACKGROUND OF THE INVENTION

This invention relates to the field of heat sink and heat spreader structures and, more particularly, to heat sink/spreader structures which utilize thermoelectric effects to more efficiently dissipate thermal energy from heat sources including electronic devices and circuits.

DESCRIPTION OF THE RELATED ART

The performance levels of microelectronic devices (e.g., integrated circuits, power amplifiers) are continually increasing to keep pace with the demands of modern technology. Performance levels such as clock speed are closely tied to the number and density of features (e.g., transistors) patterned onto the microelectronic device. Faster processing by the microelectronic device demands faster clock speeds. Faster clock speeds, in turn, mean more switching and power dissipation per unit time.

Sub-micron transistors and other features are currently patterned onto silicon wafers with extremely high densities. For example, several million transistors can be patterned on a single square centimeter of silicon. Switching speeds as fast as a few nanoseconds can be achieved with each transistor.

In theory, the performance levels of microelectronic devices should continually improve as the size of the transistors is decreased and the density of the features is increased. In practice, however, small, closely packed features dissipate large amounts of heat which limit performance levels. Heat is often dissipated from small, select regions of the device typically by heat sinks.

Temperature control has thus emerged as the limiting factor in the design of microelectronic devices. New-age devices, such as high-power amplifiers and multi-chip modules, radiate particularly large amounts of heat. Failure to effectively conduct away heat leaves these devices at high operating temperatures, ultimately resulting in decreased performance and reliability.

Heat sinks are most efficient when there is a uniform heat flux applied over the entire base. "Spreading resistance" occurs when a heat sink with a large base-plate area is attached to a heat source of a smaller footprint area. This results in a higher local temperature at the location where the heat source is placed. The spreading resistance is directly influenced by the following variables:

Footprint or contact area of the heat source;
Footprint area of the heat sink base-plate;
Thickness of the heat sink base-plate;
Thermal conductivity of the heat sink base-plate;
Average heat sink thermal resistance;
Location of the heat source relative to the base-plate center point.

The typical approach to overcoming spreading resistance is to increase the size of the heat sink, increase the thickness of the base, increase the airflow across the heat sink, or decrease the incoming air temperature. These steps increase weight, noise, system complexity and expense. When a solution cannot be achieved, the impact can be lost profits due to reduced electronics' performance, decreased reliability due to high operating temperatures, increased fan speeds and delays in new product introductions while thermal issues are resolved.

To improve the thermal performance of an electronics or integrated circuit package, heat sinks and heat spreaders are added either internally or externally to the packages. However, the typical materials utilized exhibit a variety of shortcomings including: thermal expansion mismatch between the heat spreader and the chip, excessive weight, high cost and marginal thermal performance.

U.S. Pat. No. 5,229,327, granted to Farnworth on Jul. 20, 1993 discloses structures to cool semiconductor devices with Peltier junctions. Electric current is passed through the Peltier junctions and semiconductor device (both in series) via a heat sink acting as an electrical bus and mechanical support. In addition, layers of metal and semiconductor material are progressively layered upon a semiconductor die (over a passivated layer) and junctions formed to yield peltier cooling. Power to the Peltier junctions (positive and negative terminals) is provided through the semiconductor die.

U.S. Pat. No. 5,637,921, granted to Burward-Hoy on Jun. 10, 1997 relates to a cooled electronic component package in which a single or multistage thermoelectric device contacts an integrated circuit chip via a cold plate. The chip and thermoelectric device are located within a sealed component package cavity in order to cool the chip to sub-ambient temperatures without condensation.

U.S. Pat. No. 5,714,791, granted to Chi, et al. on Feb. 3, 1998 discloses a micromachined Peltier device in which a silicon substrate is doped from one face to yield thin P and N-type thermoelements on top of a thin silicon membrane. The cold junctions of the thermoelements are located above a cavity (aperture) to minimize thermal conduction through the silicon substrate.

U.S. Pat. No. 6,196,002, granted to Newman, et al. on Mar. 6, 2001 relates to a ball grid array (BGA) integrated circuit package containing a thermoelectric device cooling the IC chip. Power for the thermoelectric cooler is supplied by the BGA package via conductive contacts. The thermoelectric cooler is positioned partially within the package substrate and one face (which contacts the IC chip) is cooler than the opposite thermoelectric face.

U.S. Pat. No. 5,569,950, granted to Lewis, et al. on Oct. 29, 1996 relates to a device to monitor and control the temperature of IC chips with a thermoelectric cooler and thermocouple sensing. A thermocouple, placed between the chip and thermoelectric cooler, provides feedback to regulate power to the cooler.

U.S. Pat. No. 5,598,031, granted to Groover, et al. on Jan. 28, 1997 discloses an IC package whereby the IC chip is mounted to a separate silicon substrate (larger in surface area than chip) in order to provide heat spreading via thermal conduction. Additionally, electrical pads and circuit traces are disposed onto the substrate surface (over an oxide layer) in order to provide electrical connection between the IC chip and package.

U.S. Pat. No. 5,837,929, granted to Adelman on Nov. 17, 1998 discloses a thermoelectric device and fabrication method in which a doped semiconducting substrate contains oppositely doped regions thereby creating positive and negative type thermoelements. These vertically oriented thermoelements are electrically isolated by etching spaces and filling the spaces with a polyimide material.

U.S. Pat. No. 4,211,888, granted to Stein, et al. on Jul. 8, 1980 relates to a thermopile in a star-like pattern on top of a semiconductor substrate. One thermoelement type is formed by doping regions on the substrate and the dissimilar thermoelement type is a metal layer deposited over an oxide. The center junctions of the thermopile are heated by a source of thermal radiation to be measured.

U.S. Pat. No. 5,956,569, granted to Shiu, et al. on Sep. 21, 1999 relates to a thermoelectric cooler structure and fabrication method in which the cooler is formed on the backside of a semiconductor substrate. The thermoelements, perpendicularly oriented to the substrate, are fabricated by etching the substrate, depositing doped polysilicon layers, oxide insulating layers and metal contact layers.

U.S. Pat. No. 4,646,126, granted to Iizuka on Feb. 24, 1987 relates to a multiple IC chips mounted to a separate silicon substrate (via an oxide layer) and wiring layers interconnecting them.

U.S. Pat. Nos. 5,777,385 and 6,162,659, granted to Wu on Jul. 7, 1998 and Dec. 19, 2000 respectively disclose an electronic package structure in which a silicon heat spreader substrate is bonded to the backside to an IC chip via discrete, raised solder joints.

U.S. Pat. No. 5,032,897, granted to Mansuria, et al. on Jul. 16, 1991 discloses an integrated circuit package in which the IC chip is bonded to a thermoelectric cooler (thermoelements oriented perpendicular to the IC chip) and positioned within the package cavity.

U.S. Pat. No. 6,222,113, granted to Ghoshal on Apr. 24, 2001 relates to a thermoelectric cooler whose thermocouples are mounted to a doped semiconducting substrate with discrete conductive regions corresponding to each electrical interconnection member connecting both thermoelement types. Power is thereby supplied to the thermoelectric cooler's thermocouples (mounted between the two substrates) via both substrates.

U.S. Pat. No. 6,094,919, granted to Bhatia on Aug. 1, 2000 relates to an IC package whose lid contains an integrated thermoelectric cooler comprising thermoelements oriented perpendicularly to the lid and IC chip.

U.S. Pat. No. 5,061,987, granted to Hsia on Oct. 29, 1991 discloses an electronic package comprising a silicon substrate to which an IC chip is bonded. Electrical pads and circuit traces are disposed to the faces of the substrate and conductive vias are formed (through doping) to electrically connect both substrate faces. Additionally, a silicon cover is hermetically sealed to the substrate.

U.S. Pat. No. 4,092,614, granted to Sakuma, et al. on May 30, 1978 discloses a semiconductor laser in which a silicon crystal body is sandwiched between a metal body and semiconductor laser crystal body thereby providing a thermal and electrical path through the entire sandwich.

U.S. Pat. No. 6,091,142, granted to Lee on Jul. 18, 2000 relates to a stacked semiconductor package in which multiple IC chips are mounted between and supported by becker and cap structures. Additionally, one heat sink is mounted to the wire bond pads and another is mounted under each chip, thereby requiring at least one heat sink per IC chip. Both heat sinks protrude from the becker and cap to radiate heat.

U.S. Pat. No. 5,051,865, granted to Kato on Sep. 24, 1991 discloses a stacked semiconductor structure in which a plurality of chip sets (each comprised of a heat plate sandwiched by two IC chips) are bonded and electrically interconnected. Bonding between chip and heat sink is accomplished through conductive paste or solder in order for electrical power to be transferred between components.

U.S. Pat. No. 4,698,662, granted to Young, et al. on Oct. 6, 1987 relates to a multichip module is which IC chips are dielectrically bonded to a silicon substrate which, in turn, is dielectrically bonded to a heat sink. Electrical conductive traces are deposited onto the substrate's surface to provide electrical connection between the chips and package pins.

Now, the field of Thermoelectricity relates to the thermodynamic effects of temperature differentials, electric potential gradients and current flow in single and multiple dissimilar electrical conductors or semiconductors. There are basically three effects which comprise this field including: the Seebeck Effect, the Peltier Effect and the Thomson Effect.

In 1821, Seebeck found that when two dissimilar conducting or semiconducting materials are joined to each other at both ends and if there is a temperature differential between these two ends, an EMF, or voltage, will be established within the two materials. This effect is called the Seebeck Effect. The effect arises because the presence of a temperature gradient in a material causes a carrier-concentration gradient and an electric field is established which causes the net flow of charge carriers when the conductors are joined into a closed electrical circuit.

In 1834, Peltier observed that heat was either liberated or absorbed at the junction of two dissimilar conductors or semiconductors when an electric current was passed through the junction. Measurements established that the rate of absorption or liberation of heat at the junction was directly proportional to the electric current. The effect arises because the potential energy of the charge carriers is in general different in the two conductors and also because the scattering mechanisms that govern the equilibrium between the charge carriers and the crystal lattice differ in the two conductors.

Therefore, in order to maintain a conservation of energy as well as a conservation of charge when charge carriers move across the junction, energy must be interchanged with the surroundings of the junction. As in the case of the Seebeck Effect, the Peltier Effect cannot be ascribed to either material alone but rather is a consequence of the junction.

In 1857, Thomson found that an energy interchange with the surroundings took place throughout the bulk of a conductor if an electric current was allowed to flow while a temperature gradient existed in the conductor. The rate of energy absorbed or liberated per unit length was proportional to the product of the electric current and the temperature gradient. The reasons for the existence of the Thomson Effect are essentially the same as those that cause the Peltier Effect. However, the difference in the potential energy of the charge carriers and in the scattering mechanisms are the consequences of the temperature gradient and not of the inhomogeneities in the conductor.

Additionally, charge carriers which flow (induced by a voltage) from one region of any conductive or semiconductive material to another carry with them small quantities of heat energy. If the carriers originally at one temperature in the conductor are displaced to cooler surroundings, they must discharge their excess kinetic energy by collisions with the lattice, thereby maintaining a conservation of energy. This process assists the normal thermal conduction of heat energy in the conductor, which would occur in the absence of charge carrier (electric current) flow.

By combining the electric charge induced (active) heat transfer mechanisms created by the thermoelectric effects with the thermal conduction/radiation (passive) heat transfer mechanisms of typical heat sink/heat spreader structures, a more effective heat management structure is produced.

SUMMARY OF THE INVENTION

Accordingly, it is the overall object of the present invention to develop and construct heat sink/heat spreader structures, which utilize thermoelectric effects in order to more effectively transfer thermal energy from various sources including electronic components. More effective heat dissipation results in thinner, smaller volume and lower cost heat sinking structures.

It is an object of the present invention to provide a heat sink/spreader structure in which the structure itself is a thermoelectric couple, which may have an external electric potential applied.

An additional object of the present invention provides a heat sink/spreader structure comprising a thermoelectric couple with elements connected together at both ends. When subjected to a temperature gradient, an EMF and corresponding current is established within the couple resulting in the absorption and liberation of heat at these junctions without the need for external electrical power.

Another object of the present invention is to provide a heat sink/heat spreader structure, comprising of simply an electrically conductive heat sink, wherein the heat sink has an external electric potential applied in order to induce multiple heat transfer effects through the structure.

Yet Another object of the present invention is to provide the thermoelectric couple(s) of the heat sink/spreader structure in electrical series with an external electric load such as an integrated circuit or other electronic component.

Still another object of the present invention is to provide optimal materials for the thermoelements comprising the heat sink/heat spreader structure.

Another object of the present invention is to provide a heat sink/spreader structure comprised of multiple thermoelectric couples, in a planar configuration, combined with a heat sink.

One object of the present invention is to have each thermoelement leg containing electrically conductive material electrically in parallel with the thermoelement material in order to aid in thermal dissipation.

Again, another object of the present invention is to provide a cascaded, or multistage "planar" thermoelectric device structure wherein each successive stage is added to the horizontal plane. The heat absorbing junctions of the stage interfacing the heat source are located in the center of the structure and the heat rejecting junctions of the heat rejecting stage are located within the perimeter of the structure.

A further object of the present invention includes a single or multistage heat sink/spreader, each stage consisting of at least one thermoelement couple, in which all thermoelements are formed of a single semiconducting substrate through selective doping techniques.

One additional object of the present invention is to provide unique methods of bonding between an IC chip (heat source) and the heat sink/spreader structure.

Lastly, it is an object of the present invention is to combine all of these unique design aspects and individual fabrication techniques into effective and manufacturable heat sink/spreader structures.

BRIEF DESCRIPTION OF THE DRAWINGS

FIGS. 7a through 7d illustrate an electrical series of dissimilar thermoelements integrated with (or attachable to) a heat sink and heat source whereby either power is applied to or generated by the structures.

FIGS. 16a through 16c also illustrate the layers of the multistage heat spreader embodiment seen in FIG. 14.

DETAILED DESCRIPTION OF THE INVENTION

Described below are several embodiments of the present application which illustrate various ways the present application can be implemented. In the descriptions that follow, like numerals represent like elements in all figures. For example, where the numeral 10 is used to refer to a particular element in one figure, the numeral 10 appearing in any other figure refers to the same element.

Figure 1:
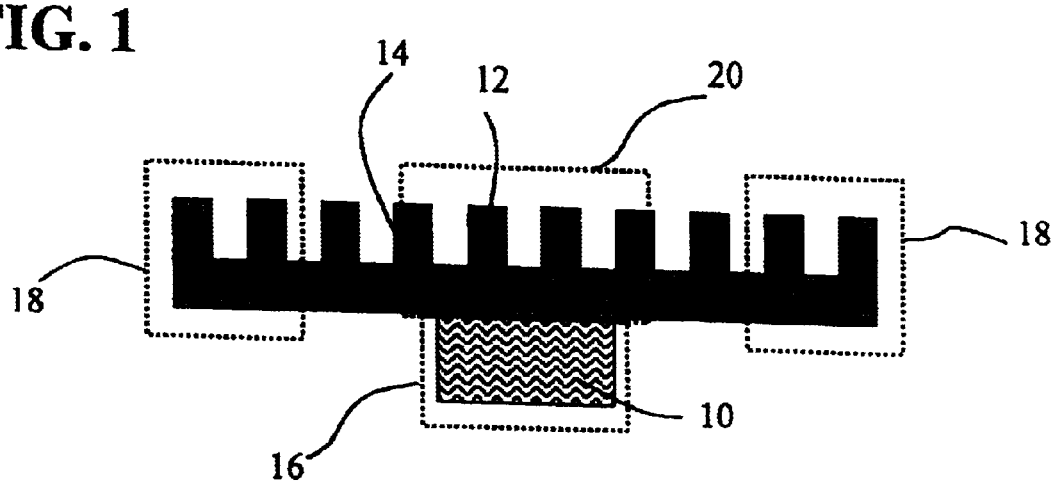
FIG. 1 is a pictorial representation illustrating conductive heat flow paths in a typical heat sink when interfaced with a heat source.

As seen in FIG. 1, a heat source 10 is attached to a heat sink 12 (comprised of a conductor or semiconductor) in a typical application to dissipate excess thermal energy. The heat source 10 may be an IC chip or other electronic component. Due to the further densification of electronic device packages, the heat sink 12 may be significantly larger in length and width than that of the heat source 10 in order to dissipate enough heat. As thermally conducted heat 14 moves outward from the heat source region 16 and through the heat sink 12, the sink perimeter regions 18 do not receive as much heat as the sink center region 20 immediately adjacent the heat source region 16. As a result, thermal spreading resistance becomes a major limiting factor in the heat sink's ability to dissipate heat to the surrounding ambient environment.

Figure 2:
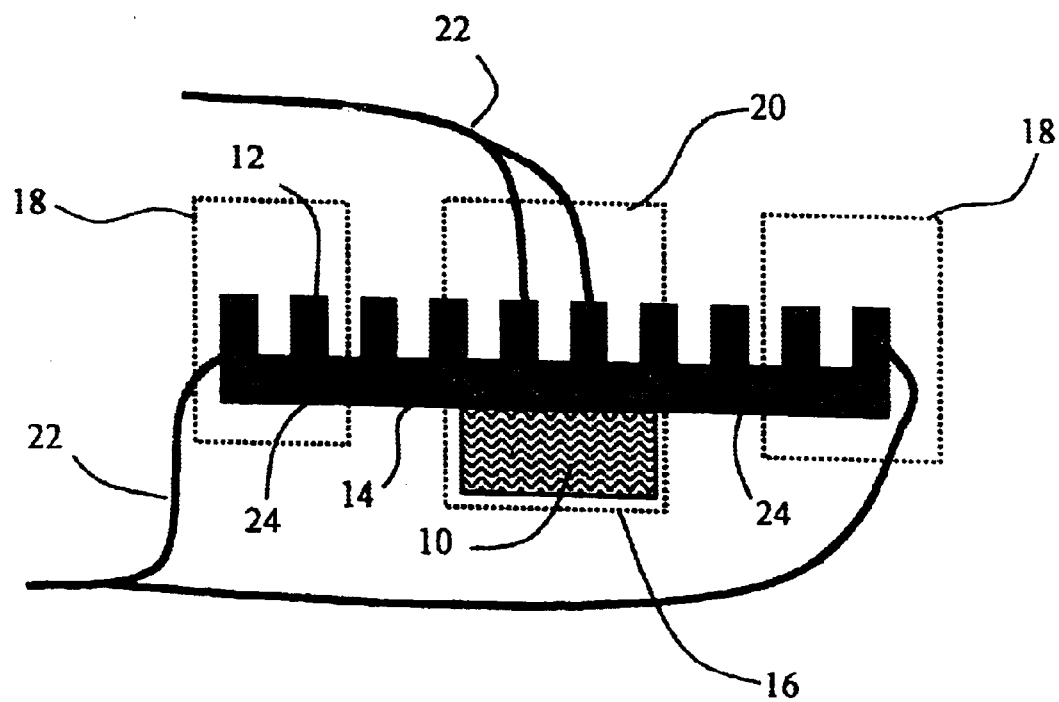
FIG. 2 illustrates the utilization of multiple heat transfer effects in the present invention.

FIG. 2 illustrates how the heat sink 12, carrying an electric current, can induce various heat transfer effects such as the Peltier Effect, Thomson Effect and the ability of charge carriers to carry thermal energy when under the influence of a voltage.

Similar to FIG. 1, the heat source 10 (IC chip), attached to a heat sink 12, again has a center region 20, which receives most of the thermally conducted heat 14 from the heat source region 16. In this example, however, an electric potential is applied (via power leads 22) across the heat sink 12 and induces charge carrier flow 24 (electron flow in metals, electron and hole flow in N and P-type semiconductors respectively) thereby absorbing heat energy from the sink center region 20 (hotter region on the heat sink) and dissipating the heat to the sink perimeter regions 18, resulting in higher heat sink efficiency. This thermal anisotropy, or directional heat transfer, is more effective at removing thermal energy from a localized heat source than conventional materials such as metals.

Additionally, the electrically conductive or semiconductive heat sink 12 may be attached to the heat source 10 (IC chip) through wafer bonding techniques disclosed in FIG. 8.

Preferable semiconducting materials for all semiconducting thermoelements in all embodiments of the present invention include, but are not limited to: silicon, carbon (fiber or graphite), silicon carbide, gallium arsenide or electrically conductive polymers. It has been found that Silicon of P-type conductivity and of a purity less than or equal to 99.9% possesses good performance and is quite economical.

FIGS. 3a through 3g demonstrate a process flow for the fabrication of a heat sink/spreader structure 26, which utilize thermoelectric effects to remove thermal energy more efficiently from a IC chip, or heat source 10. In this embodiment, a heat sink 12 and thermoelement material 28 are each thermoelements comprising one thermoelectric couple.

Figure 3A:
FIGS. 3a through 3g illustrate one method for fabricating a heat sink/spreader structure with conductive and thermoelectric heat flow paths.

As shown in FIG. 3a, a thermoelement material 28 (conductor or semiconductor) is provided in sheet form. The material 28 may be in the form of more than one layer and may first be applied to a dielectric for structural purposes.

Figure 3B:
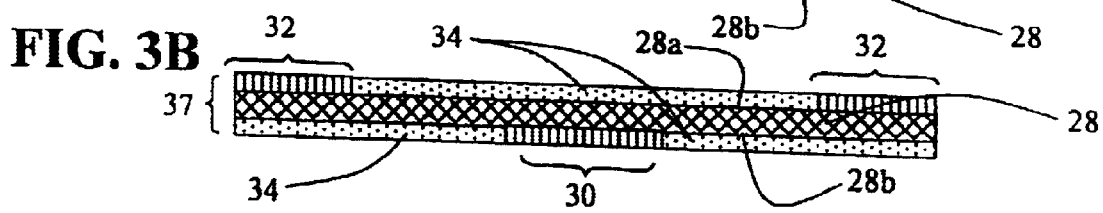

As seen in FIG. 3b, dissimilar electrical conductors (dissimilar in composition to the thermoelement material 28) are bonded to the thermoelement faces 28a, 28b yielding a heat absorbing junction 30 on one face 28b and a heat rejecting junction 32 on the opposite face 28a. To maximize heat spreading through the thermoelement, the heat absorbing junction 30 is positioned near the center of the thermoelement face 28b and the heat rejecting junction 32 is positioned near the perimeter of the thermoelement face 28a.

In any of the embodiments of the present invention, the application of dissimilar conductive material to the thermoelement material may utilize a metallic spraying process such as plasma or flame spraying, electroless or electroplating, thermal evaporation or sputtering.

Figure 3C:
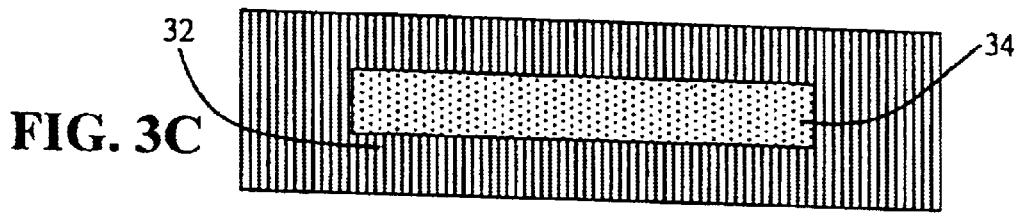

FIG. 3c, a top view of FIG. 3b, illustrates the heat rejecting junction 32 pattern and dielectric layer 34 as applied to the thermoelement faces 28a, 28b. The junction 32 is electrically continuous around the perimeter of the thermoelement 28 thereby creating a more uniform distribution of charge carrier flow and heat transfer to the thermoelement 28 perimeter.

Figure 3D:
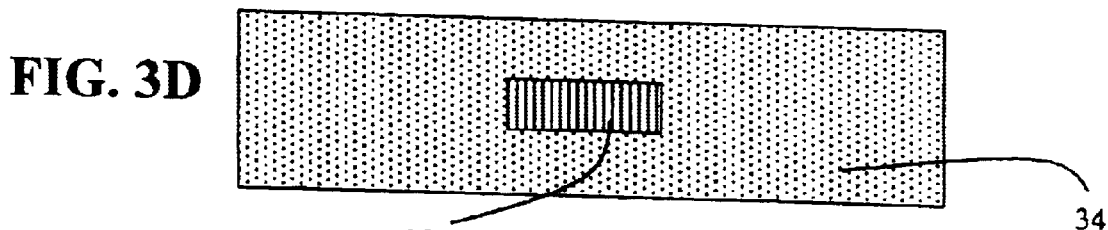

FIG. 3d, a bottom view of FIG. 3b, illustrates the heat absorbing junction pattern 30 and dielectric layer 34 as applied to the thermoelement face 28b opposite that of the heat rejecting junction 32.

Figure 3E:
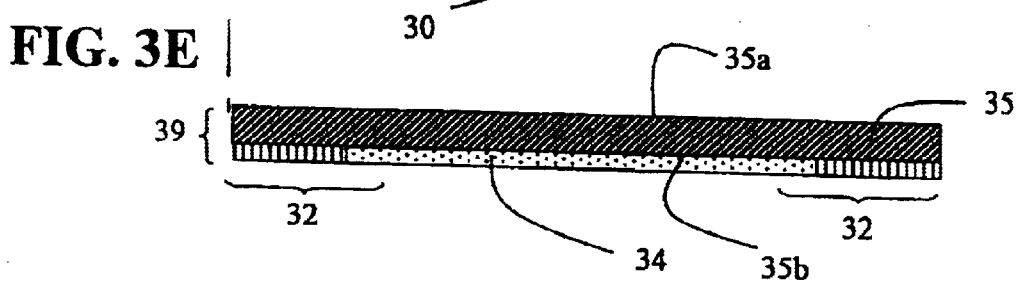

It can be seen in FIG. 3e that a dielectric layer 34 and a heat rejecting junction 32 have been applied to one face 35b of a dissimilar conductor (dissimilar in composition to the thermoelement 28) or semiconductor 35. The resultant pattern (bottom view) is also depicted in FIG. 3c. The dissimilar conductor 35 may comprise more than one layer.

Figure 3F:
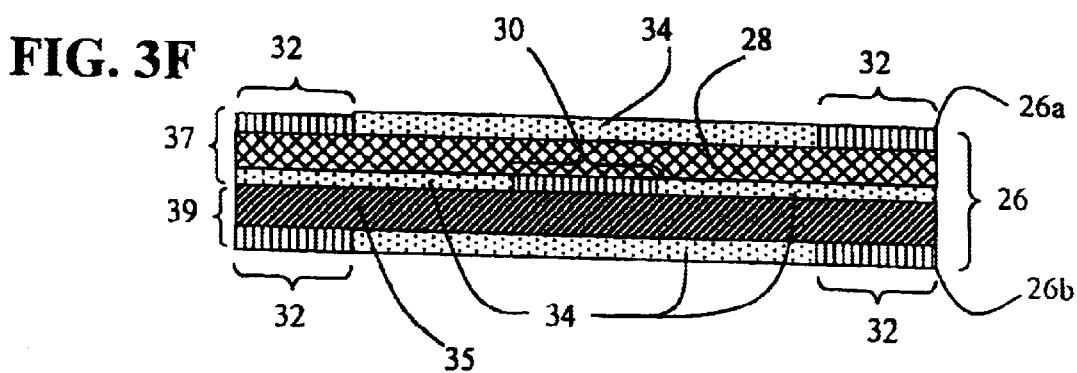

In FIG. 3f, the two dissimilar semiconductor structures 37, 39 (seen in FIGS. 3b and 3e respectively) are bonded together at the heat absorbing junction 30 thereby yielding a heat sink/spreader structure 26 comprising a thermoelement couple. The dielectric layers 34 (between the junctions 32) maintain planarity of the structure's faces 26a, 26b and to mitigate thermal resistance between the structure and an optional external heat sink. The dielectric layers (between the thermoelements 28, 35) minimize thermal resistance and provide structural stability. Additionally, the junctions 32 may be embedded (flush) in the thermoelements 28, 35, eliminating the need for the dielectric layer 34.

Figure 3G:
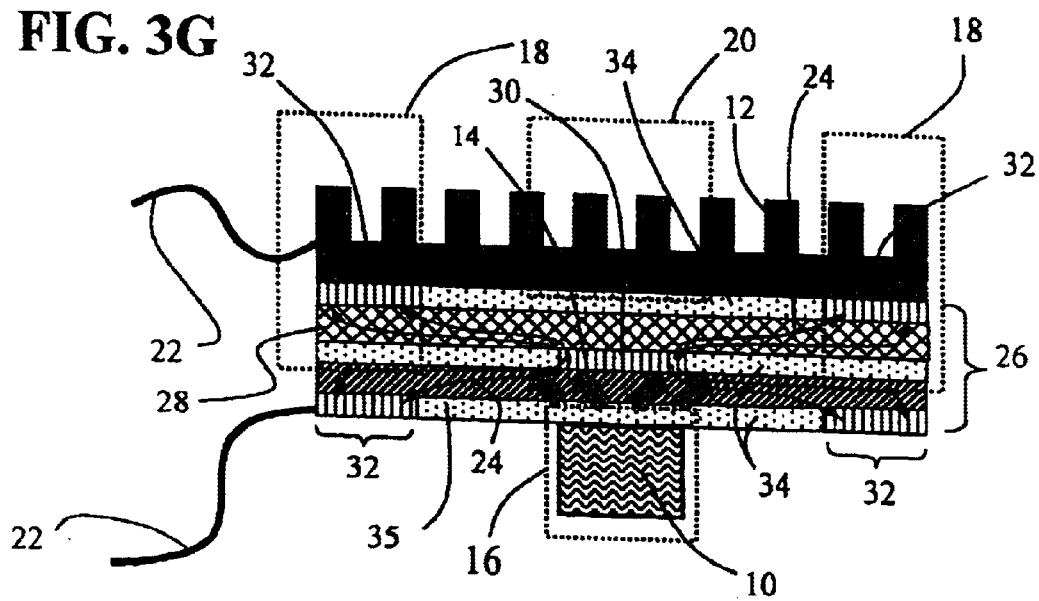

Reference is now made to FIG. 3g wherein the heat sink/spreader structure 26 of FIG. 3f is attached to the heat sink 12 through the heat rejecting junction 32 and dielectric layer 34. It can be seen that thermally conducted heat 14 continues to flow (in a parallel and perpendicular vector through the thermoelements 28, 35) into the sink center region 20. However, the applied voltage induces a charge carrier flow 24 and resultant heat transfer from the heat source region 16 (via the heat absorbing junction 30) outward (laterally) to the heat rejecting junctions 32 on the thermoelements' perimeters. By actively re-directing thermal energy from the sink center region 20, the heat sink efficiency rises and the heat source temperature drops. Of course, the actual direction of charge carrier flow 24 (and therefore the determination of junction types) is dependant upon the voltage polarity as applied to the junctions 30, 32.

Figure 4A:
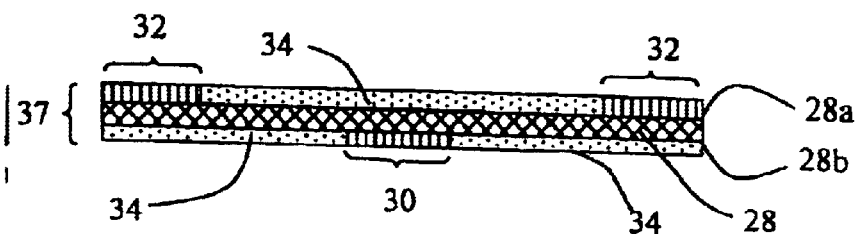
FIGS. 4a through 4c illustrate another method for fabricating a heat sink/spreader structure utilizing thermoelectric effects.
Figure 4B:
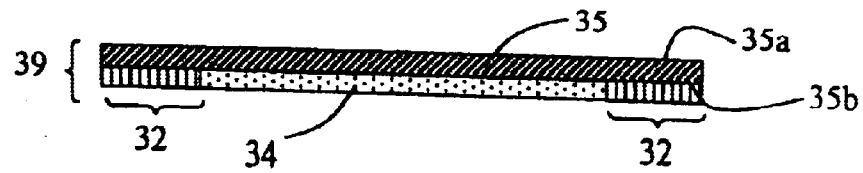
Figure 4C:
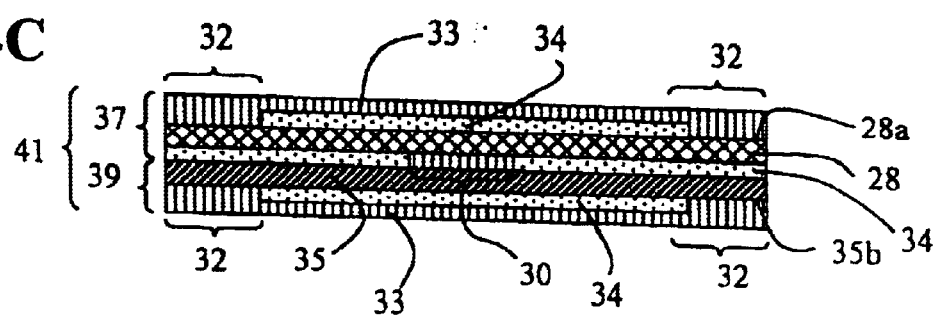

Reference is now made to FIGS. 4a through 4c wherein another method of manufacturing a heat sink/spreader structure is illustrated. The semiconducting thermoelement material 28 (may comprise more than one layer) may first be applied to a dielectric for structural purposes.

In FIG. 4a, a dielectric material 34 is selectively applied to both faces 28a, 28b of a semiconducting thermoelement material 28. Additionally, the dielectric material 34 may be applied to the entire semiconducting material 28 and then selectively removed. For example, an oxide layer may be grown/deposited onto both faces of the semiconducting material 28, selectively masked and then etched to yield the desired oxide (dielectric) 34 pattern illustrated in FIG. 4a. Additionally, it can be seen that dissimilar conductive material has been applied the exposed areas of each semiconducting thermoelement material 28 face thereby creating a heat absorbing junction 30 and a heat rejecting junction 32.

FIG. 4b includes a dissimilar thermoelement material (conductor or semiconductor) 35, a dielectric layer 34 and a heat rejecting junction 32 applied to one face 35b.

In FIG. 4c, the two dissimilar semiconductor structures 37, 39 (seen in FIGS. 4a and 4b respectively) are bonded together at the heat absorbing junction 30 thereby yielding a heat sink/spreader structure 41 comprising a thermoelement couple. The heat absorbing junction 30 (located near the center of the semiconducting thermoelement 28) and heat rejecting junction 32 (near the perimeter of the thermoelements 28, 35) can be clearly seen.

Dissimilar conductive material 33 is deposited over the exposed dielectric layers 34 and junctions 30, 32 thereby creating electrically conductive layers over the exterior faces 28a, 35b of the thermoelement materials 28, 35. The optional conductive material layers 33 provide planarity, lowering thermal resistance when attached to a heat source and heat sink. An electric potential can now be applied to both heat rejecting junctions 32.

The heat sink/spreader structure 41 may be attached to a heat source (IC chip) through wafer bonding techniques disclosed in FIG. 8.

Figure 9A:
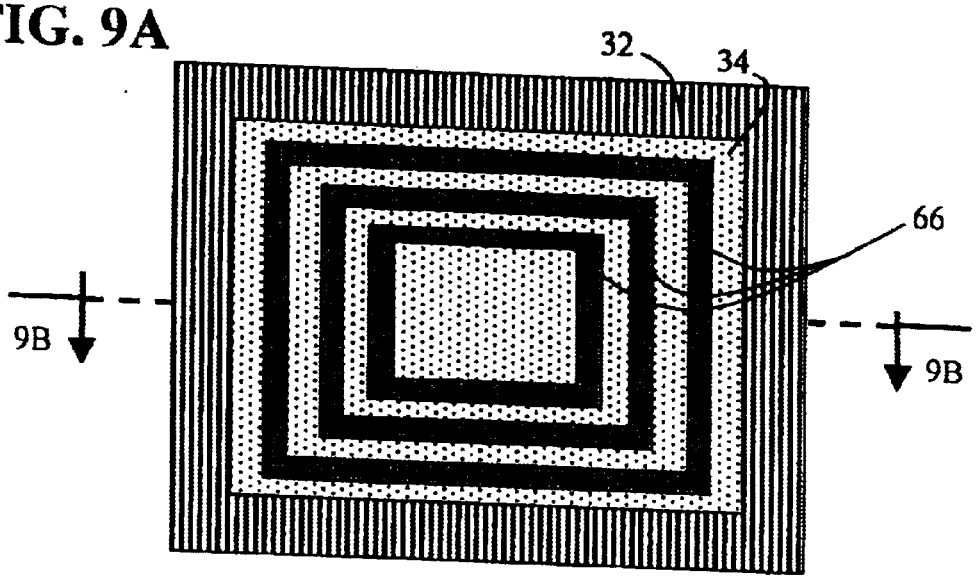
FIGS. 9a and 9b illustrate a single thermoelement couple with multiple conductive layers electrically in parallel.
Figure 9B:
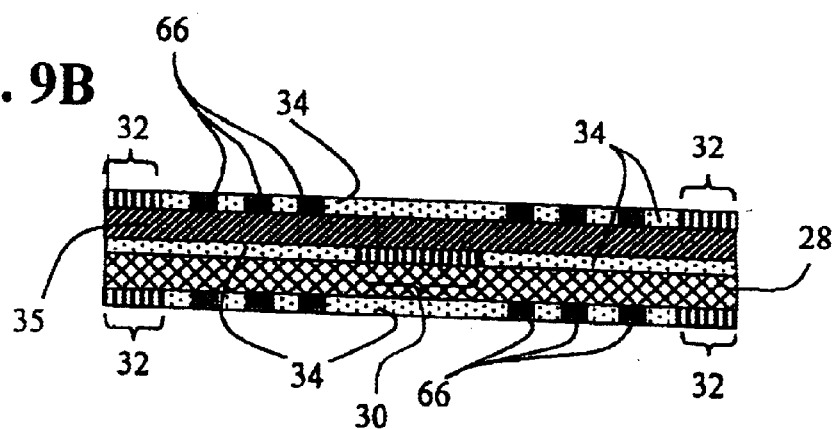
Figure 10:
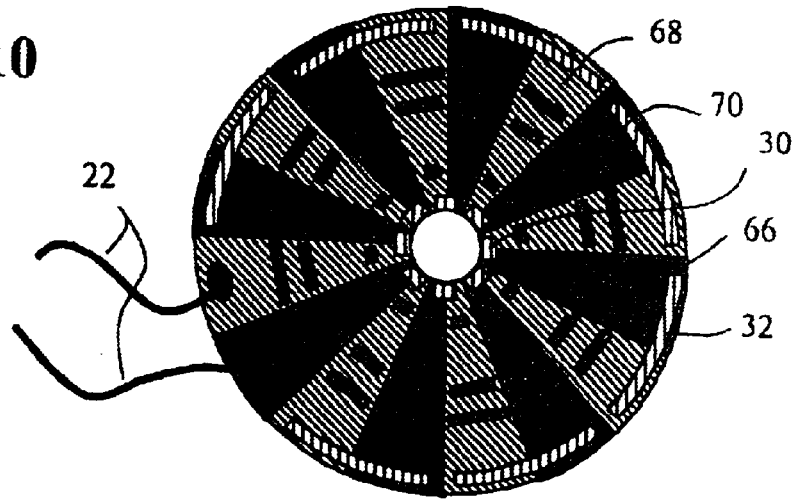
FIG. 10 illustrates multiple thermoelements in series each with multiple conductive layers electrically in parallel.

Selected portions of conductive material 33 may be applied between the heat absorbing junction 30 and heat rejecting junctions 32 on the semiconducting thermoelement materials 28, 35 thereby creating electrically conductive layers electrically in parallel with each thermoelement as seen in FIGS. 9 and 10.

Figure 5A:
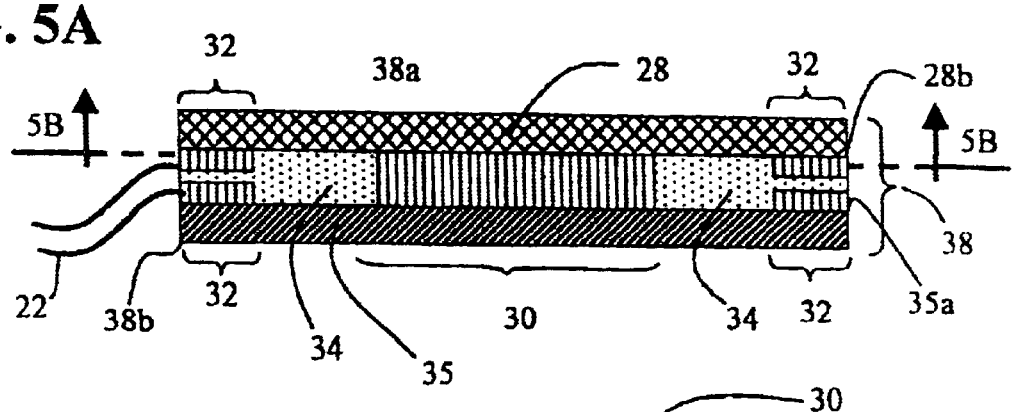
FIGS. 5a and 5b illustrate yet another embodiment for fabricating a heat sink/spreader structure of the present invention.
Figure 5B:
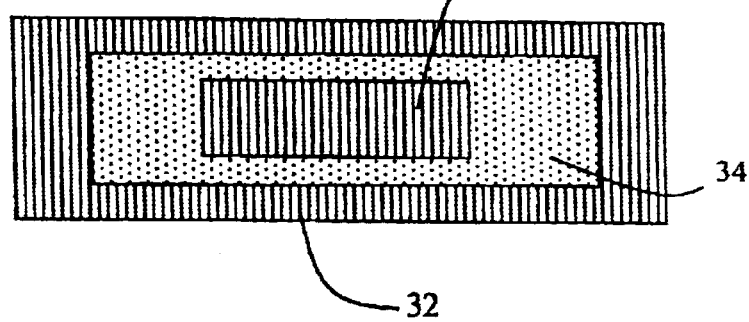

FIGS. 5a and 5b illustrate another heat sink/spreader structure of the present invention.

FIG. 5a, similar to FIG. 3f and FIG. 4c, comprises two dissimilar conductive or semiconductive thermoelements (comprised of at least one layer each) 28, 35 electrically bonded at a heat absorbing junction 30. Additionally a dielectric layer 34 is selectively deposited over the opposing faces 28b, 35a of the thermoelements 28, 35 and the heat rejecting junctions 32 thereby providing a thermal bond between both thermoelements 28, 35.

The resultant heat sink/spreader structure 38 embeds both heat rejecting junctions 32 and provides side access to the junctions 30, 32 for power leads 22. The top and bottom faces 38a, 38b of the structure 38 can accommodate direct bonding to a heat source and heat sink without additional thermal layers contributing to thermal resistance.

FIG. 5b (sectional view of FIG. 5a on lines 5b—5b), depicts the heat absorbing junction 30 (located near the center of the thermoelement layer 28) and heat rejecting junction 32 (located near the perimeter of the thermoelement layer 28) all on one face 28b of the thermoelement material 28. The dissimilar semiconductor 35 also will possess a similar junction 30, 32 and dielectric layer 34 pattern.

Figure 6:
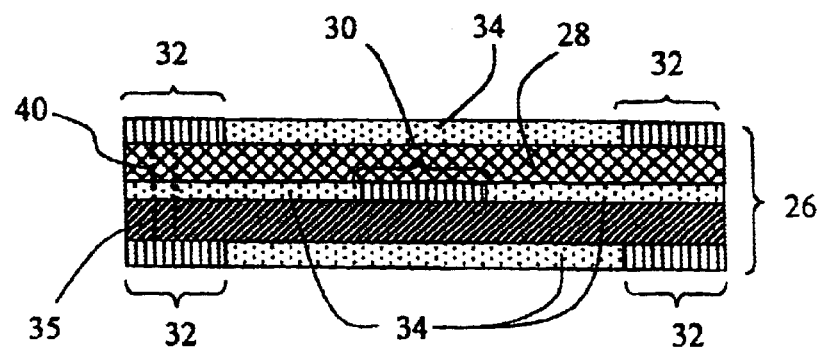
FIG. 6 illustrates another heat spreader embodiment comprised of junctions on both faces of the heat spreader and power via connections.

FIG. 6 illustrates a heat sinK/spreader structure 26 (seen in FIG. 3f) wherein an electrically conductive via 40 (electrically isolated from the thermoelement) provides a conductive path from the top thermoelement's 28 heat rejecting junction 32 to the bottom thermoelement's 35 heat rejecting junction 32. In this way, power can be supplied to the thermoelement couple (comprising the thermoelements 28, 35) at one particular location (the lower junction 32, for example) on the spreader structure 26.

FIGS. 7a through 7d illustrate a heat sink/spreader structure 44 comprising multiple thermoelement couples electrically in series. It can also be seen that the thermoelement couples can be supplied power (to move heat) or generate power from any difference in temperature between the heat absorbing junctions 30 and heat rejecting junctions 32.

FIG. 7a (a sectional view of FIG. 7c on lines 7a—7a) depicts a heat sink/spreader structure 44 in which a semiconducting thermoelement sheet is selectively doped with P-type and N-type dopants to form a continuous alternating pattern of P-type and N-type conductive thermoelements 46, 48 around a small via 50. The thermoelements 46, 48 are electrically bonded (through the use of an additional conductor or by directly bonding each P and N-type thermoelement together) thereby forming thermoelement couples with the heat absorbing junctions 30 and heat rejecting junctions 32. The semiconducting thermoelement material may first be applied to a dielectric for structural purposes. A heat sink 12 may be attached to the structure with a dielectric layer 34.

Additionally, the heat sink/spreader structure may be attached to the heat source 10 (IC chip) through wafer bonding techniques disclosed in FIG. 8.

The bottom view seen in FIG. 7b clearly illustrates the distinctive dissimilar P-type and N-type thermoelements 46, 48 and small via 50 (in the semiconducting thermoelement sheet) necessary to achieve the pattern of thermoelement couples. Electrical isolation may be provided by the depletion regions established between the semiconducting thermoelement 28 and each doped discrete thermoelement 46, 48. Also, a dielectric, such as an oxide or nitride, may be added to the physical regions between each P and N-type conductivity thermoelement 46, 48. Additionally, the physical regions between each P and N-type thermoelement 46, 48 may be removed (chemically or mechanically) in order to provide electrical insulation between each thermoelement.

Selected portions of conductive material may be applied between the heat absorbing junction 30 and heat rejecting junction 32 on the semiconducting thermoelement material thereby creating electrically conductive layers electrically in parallel with each thermoelement as seen in FIGS. 9 and 10.

Figure 11A:
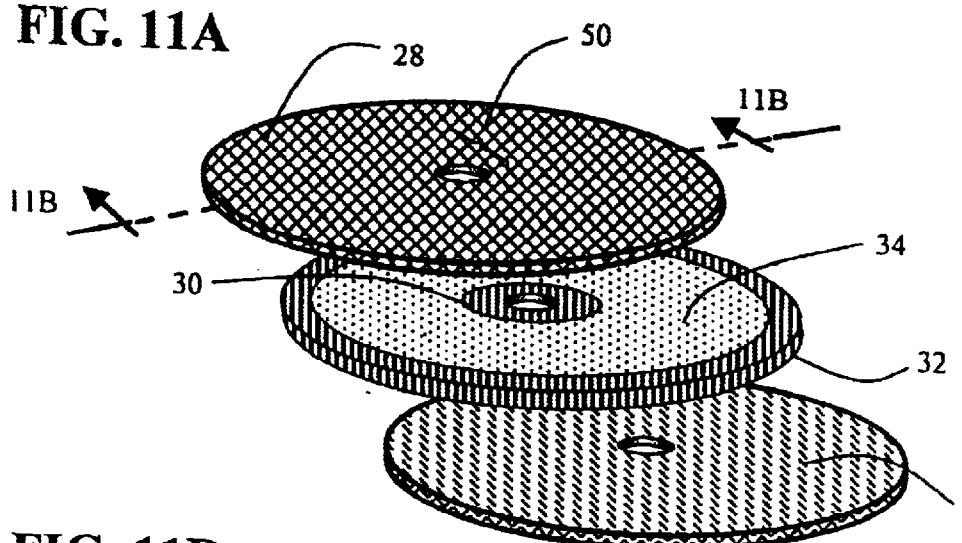
FIGS. 11a through 11c illustrate a closed circuit thermoelectric couple as one embodiment of the present invention.
Figure 11B:
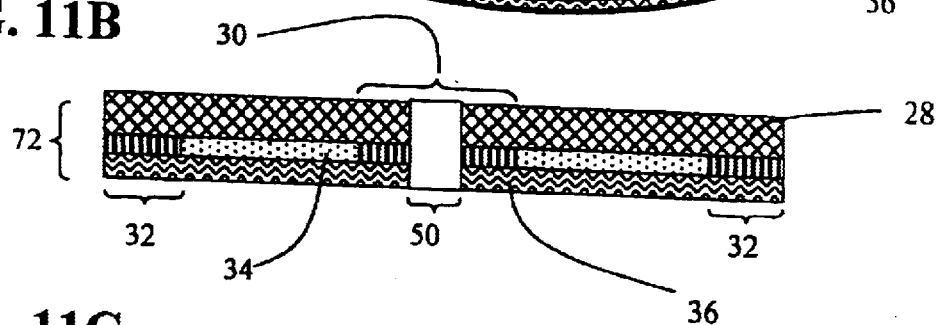
Figure 11C:
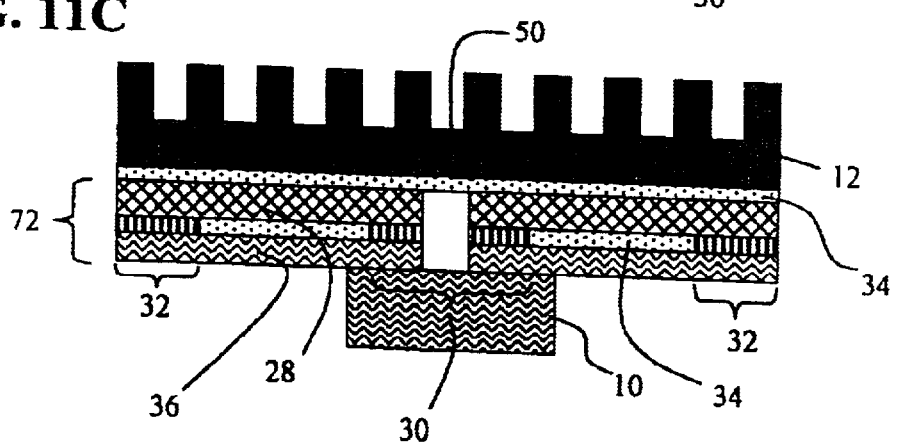

Additionally, each thermoelement couple may be electrically bonded to itself at both the heat absorbing and heat rejecting junctions 30, 32 thereby creating closed electrical circuit thermoelement couples as seen in FIGS. 11a through 11c.

In another embodiment, the semiconducting thermoelement material may be applied to a dielectric layer prior to the fabrication of the thermoelement couples thereby creating a thin, flexible semiconductor material layer (supported by a thin dielectric material) comprising P and N-type thermoelements.

Within FIG. 7c (bottom view), the heat absorbing junctions 30 (located near the center of the semiconducting material) and heat rejecting junctions 32 (located near the perimeter of the semiconductor) are visible along with leads 22 making an electrical connection to a power source 52. The structure 44 may also be electrically in series with an electrical load other than itself, such as an integrated circuit or other electronic component. In this way, the electrical current draw by both the electronic component and structure 44 will be interconnected. As the heat source 10 demands more current, more heat must be removed and thus, the heat source (electrically in series) will also receive additional current, which will increase heat transport capacity. Any embodiment of the present invention (heat sink, thermoelement couple or the like) may be connected electrically in series with another load, such as the embodiment illustrated here in FIG. 7c.

In another embodiment of the present application, the power requirement of the heat sink/spreader structure 44 can be augmented by utilizing its own internal electrical resistance as a resistive load for an electronic component or power supply circuit. In one example, voltage positioning is utilized by some CPU circuits to reduce power consumption. The CPU's core voltage, reduced as the power load increases, is controlled with power supply ICs which implement a droop resistor. This low ohmic value resistor, placed in the load's (CPU) path, consumes some of this power thereby reducing power efficiency of the system. By combining the power requirements of both the droop resistor and the heat dissipating structure 44, CPU power can be reduced and heat generated by the circuitry can be dissipated efficiently. Any embodiment of the present application (heat sink, thermoelement couple or the like) may utilize its own internal electrical resistance as a resistive load, such as the embodiment illustrated here in FIG. 7c.

Lastly, FIG. 7d (bottom view) depicts the heat dissipating structure 44 in which the leads 22 deliver power generated by the thermoelement couples to an external load 54 for consumption. As described in the background, a temperature differential experienced between the heat absorbing junctions 30 and heat rejecting junctions 32 of the structure 44 will generate a voltage and corresponding current when connected to the external load 54. Any embodiment of the present invention (thermoelement couple or the like) may generate electrical power and deliver it to an external load, such as the embodiment illustrated here in FIG. 7d.

Figure 8A:
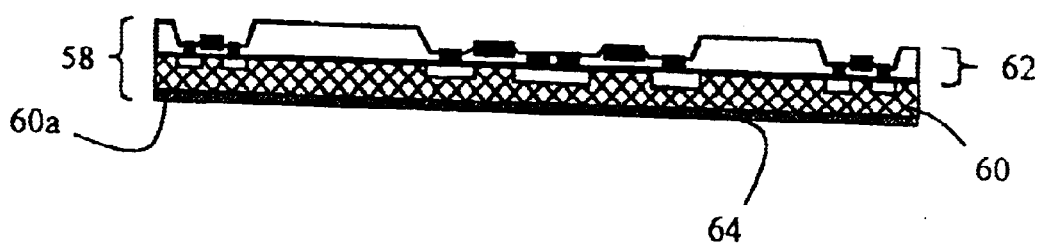
FIGS. 8a through 8c illustrates a method of manufacture involving wafer bonding of a heat sink/spreader structure to an IC chip.
Figure 8B:
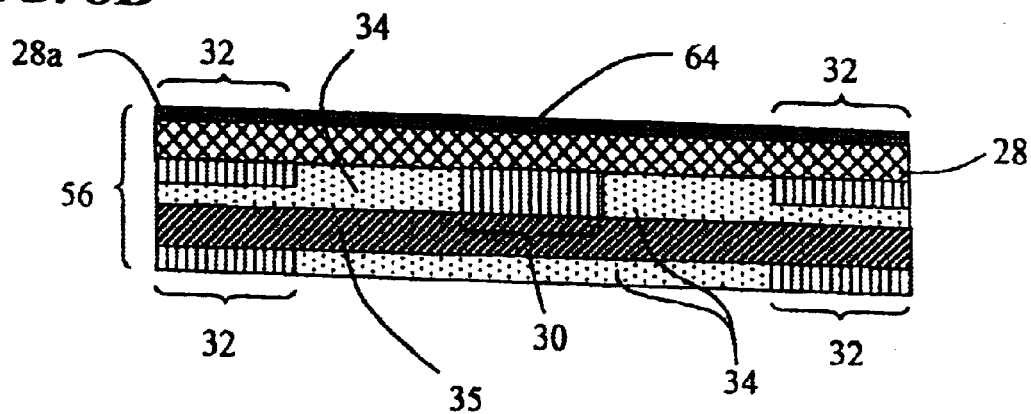
Figure 8C:
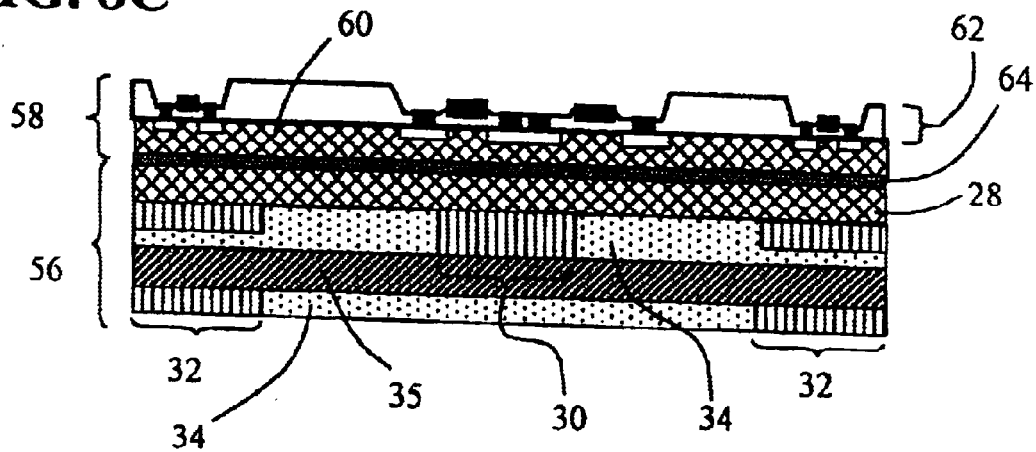

FIGS. 8a through 8c illustrate the wafer bonding of a heat source (IC chip 58) to a heat sink/spreader structure 56 in order to create an attachment of high thermal and mechanical integrity.

FIG. 8a illustrates the heat source as a typical IC chip structure 58 comprised of a silicon substrate 60 and active circuitry layer 62. Depending on the wafer bonding technique utilized and the possible need for electrical isolation, a dielectric layer (oxide) 64 may be applied to the substrate's backside 60a prior to bonding.

FIG. 8b depicts a heat sink/spreader structure 56 (similar to the structures seen in FIG. 3f and FIG. 6) wherein a thermoelement couple is created through the bonding between a conductor or semiconductor 28 (preferably a composition similar to the IC chip substrate) to at least one dissimilar conductor or semiconductor 35. The structure's 56 thermoelement couple comprise at least one heat absorbing junction 30 and two heat rejecting junctions 32. In this embodiment, the face 28a of the semiconductor 28 opposite the junctions 30, 32 will be wafer bonded to the IC chip substrate 60 backside 60a.

There are several wafer bonding techniques that can be used to achieve different bonds. These can be classified as anodic, direct, or intermediate-layer bonds. The last category includes eutectic and glass-frit bonds. The general process of wafer bonding can be summarized as a three-step sequence: surface preparation, contacting, and annealing.

Wafer bonding in the present invention may utilize, but is not limited by the specific techniques disclosed.

Anodic bonding relies on charge migration to produce bonded wafers. This usually involves a silicon wafer and a glass wafer or layer with a high content of alkali metals. In this approach, the presence of mobile metals is exploited by applying a high negative potential to the glass to attract the positive ions (Na+) to the negative electrode, where they are neutralized. The bond is performed at temperatures of up to 500° C., which increases the mobility of the positive ions. Furthermore, driven by the existing electric field, oxygen from the glass is transported to the glass-silicon interface where it combines with silicon to form SiO2, which creates a permanent bond.

Silicon direct wafer bonding (DWB), also known as fusion bonding, is performed by joining two silicon wafers together. This is done by creating hydrophobic or hydrophilic surfaces that are brought into contact and annealed at high temperatures. The bond is originated by pressing in the middle of one of the wafers to create an initial point of contact while mechanical spacers keep the wafers physically separated. Subsequent heating dehydrates the surface and causes a number of processes to take place. The hydroxyl groups form water molecules that in turn promote the oxidation of the bonding surfaces, creating a Si—O—Si bond as the hydrogen diffuses away.

In eutectic and glass-frit bonding, intermediate films are deposited before the bond; these are metallic in the former case and glass in the latter. The alloy is formed by solid-liquid interdiffusion at the interface, followed by solidification upon cooling. Pressure is applied while the wafers are maintained at the appropriate temperature.

With Glass-frit bonding, a thin glass layer is deposited and preglazed. The wafers are then brought into contact at the rated melting temperature of the glass, which is always <600° C. Pressure is also applied to keep the samples in intimate contact.

Any one of the techniques mentioned is capable of creating the wafer bond between the IC chip 58 and heat sink/spreader structure 56 seen in FIG. 8c.

FIGS. 9a (plan view) through 9b (sectional view of FIG. 9a on lines 9b—9b) illustrate a single thermoelement couple (comprised of two dissimilar semiconducting thermoelement materials 28, 35) wherein a conductive material 66 is selectively deposited between the heat absorbing junction 30 and heat rejecting junctions 32. The conductive material 66 will therefore be electrically in parallel with a portion of at least one of the semiconducting thermoelements 28, 35. As charge carriers flow through the thermoelement couple, thermal energy will be absorbed at the heat absorbing junction 30 (located near the center of the semiconductors 28, 32) and liberated at the heat rejecting junctions (located near the perimeter of the semiconductors 28, 32) 32. However, due to a partial parallel circuit (created by the parallel conductive members 66), some of the thermal energy is exchanged with the surroundings where the conductive members 66 contact the thermoelement 28. The semiconducting thermoelement surface now contains multiple mini-heat rejecting junctions (at each conductive junction point) thereby facilitating thermal dissipation along the thermoelement's surface.

FIG. 10 illustrates an electrical series of thermoelement couples comprising heat absorbing junctions 30 and heat rejecting junctions 32 wherein a conductive material 66 is selectively deposited onto each thermoelement 68, 70. As seen in FIGS. 9a and 9b, the conductive layers 66 are electrically in parallel with a portion of the thermoelements 68, 70 in order to facilitate the dissipation of thermal energy at these contact points. Power leads 22 allow the structure to be electrically powered to induce the Peltier Effect and thus thermal transfer.

The embodiment in FIGS. 11a through 11c illustrate a closed circuit thermoelement couple structure 72 comprising a thermoelement couple which is neither connected to a power source or external load.

Within FIG. 11a, the heat absorbing junction 30, heat rejecting junction 32 and dielectric layer 34 are (shown together for clarity) all sandwiched between and bonded to the semiconducting thermoelement 28 and a dissimilar conductor 36. A small open via 50 (which may be dielectrically filled) facilitates the electrical isolation between the heat absorbing junction 30 (located near the center of the thermoelement 28) and heat rejecting junction 32 (located near the perimeter of the thermoelement 28) when bridged by the thermoelement 28 and dissimilar conductor 36.

The resultant structure, seen in FIG. 11b (a sectional view of FIG. 11a on lines 11b—11b), illustrates how the thermoelement 28 and dissimilar conductor 36 are electrically connected together at the junctions 30, 32 thus creating a closed circuit thermoelement couple structure 72.

Now, according to the Seebeck Effect, if the two dissimilar thermoelements 28, 36 are electrically joined to form two junctions, and if the temperature of each junction differs, a voltage and corresponding current will be developed. The actual electric "load" is the resistance of the heat rejecting junction 32. The resulting generated electric current will absorb heat via the Peltier Effect (at the heat absorbing junction 30) and transport it to the heat rejecting junction 32 where it will be dissipated.

FIG. 11c illustrates the closed circuit thermoelement couple structure 72 attached to a heat source 10 and a heat sink attached via a dielectric layer 34.

Figure 12A:
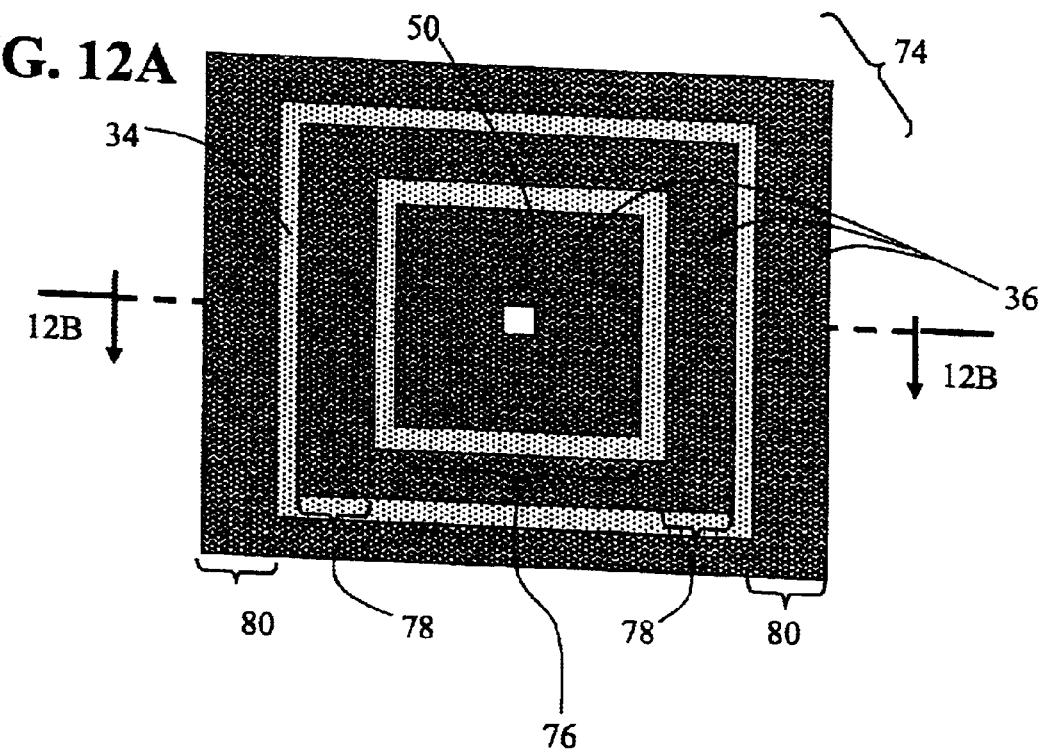
FIGS. 12a and 12b illustrate a single thermoelement couple with multiple cascaded stages.
Figure 12B:
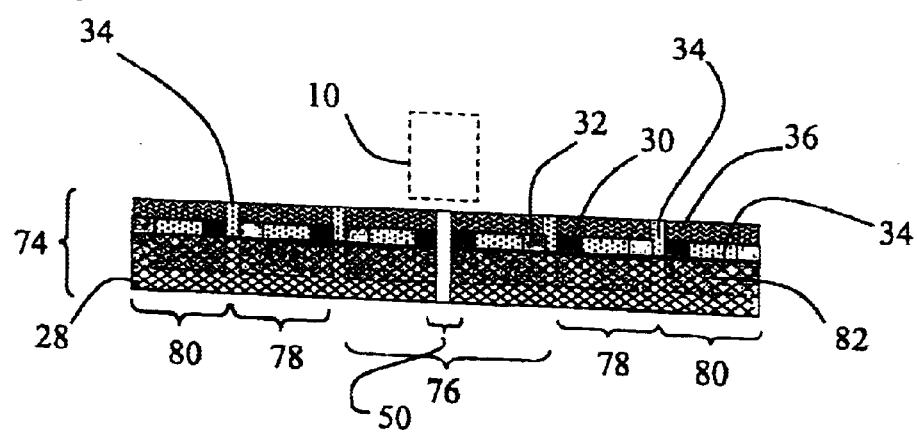

FIGS. 12a and 12b illustrate a multistage (or cascaded, structure including thermoelement couples thermally in series with each other) heat sink/spreader structure 74 wherein each stage 76, 78, 80 comprises at least one thermoelement couple with at least one heat absorbing and heat rejecting junction 30, 32. Electrical connections (which may apply a voltage) between stages are not shown for clarity. The thermoelement material may be first applied to a dielectric layer for structural reasons.

Reference is now made to FIG. 12b (a sectional view of FIG. 12a on lines 12b—12b) wherein multiple regions (comprising individual stages each with one thermoelement couple) within the semiconducting thermoelement sheet 28 are doped to yield discrete thermoelements 82 with three isolated thermoelement stages 76, 78, 80. It can be seen that each stage 76, 78, 80 contains a heat absorbing junction 30 which is located near the center of each stage and a heat rejecting junction 32 located near the perimeter. Each successive stage is laterally displaced from the previous stage (positioned outside an entire perimeter of the previous and successive stage) and the heat source region 10.

The thermoelements 82 (in each stage 76, 78, 80) are joined with a conductor or semiconductor 36 (at the heat absorbing and heat rejecting junctions 30, 32) to yield a closed circuit structure also depicted in FIGS. 11a through 11c. A small open via 50 (which may be dielectrically filled) facilitates the electrical isolation (within stage 76) between the heat absorbing junction 30 and heat rejecting junction 32 when bridged by the thermoelement 82 and dissimilar conductor 36.

Electrical isolation may be provided by the depletion regions established between the semiconducting thermoelement 28 and doped discrete thermoelements 82. It can also be seen that each successive stage is larger in thermal capacity than the previous stage.

A dielectric layer 34 is added between the junctions 30, 32 thereby improving thermal performance if attached to a heat source or heat sink.

The multistage heat sink/spreader structure 74 may be attached to a heat source (IC chip) through wafer bonding techniques disclosed in FIG. 8.

Selected portions of conductive material may be applied between the heat absorbing and heat rejecting junctions 30, 32 on the semiconducting thermoelement material 28 thereby creating electrically conductive layers electrically in parallel with each thermoelement 82 as seen in FIGS. 9 and 10.

Figure 13A:
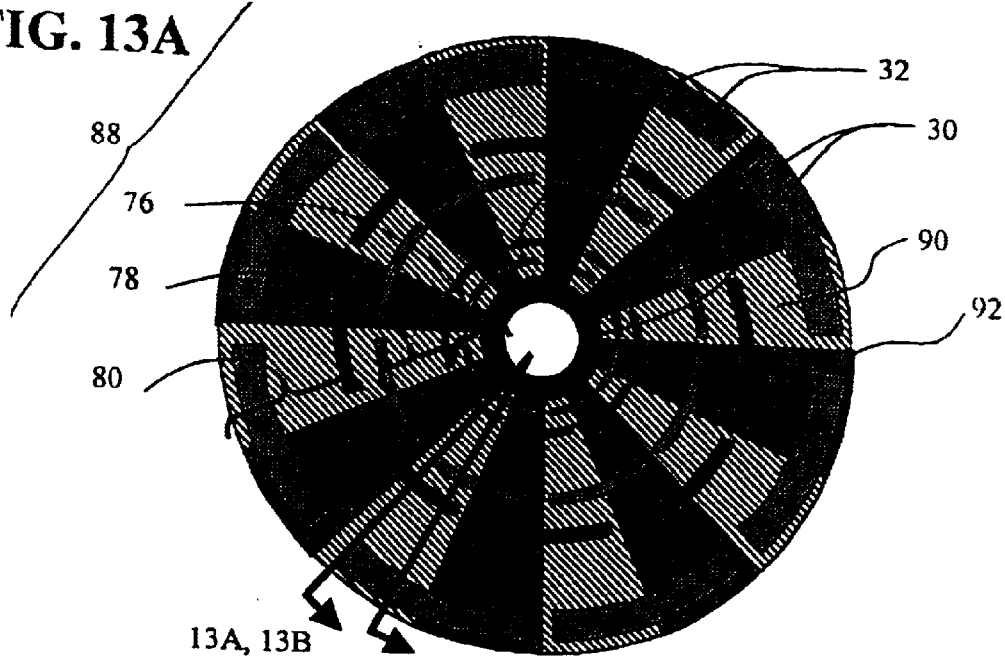
FIGS. 13a through 13c illustrate an electrical series of thermoelement couples within multiple cascaded stages.
Figure 13B:
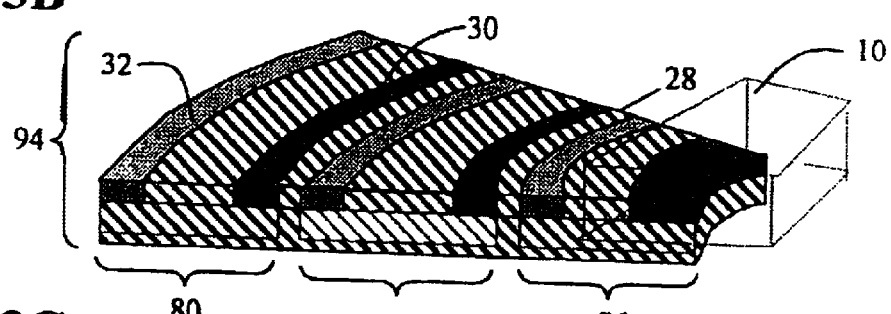
Figure 13C:
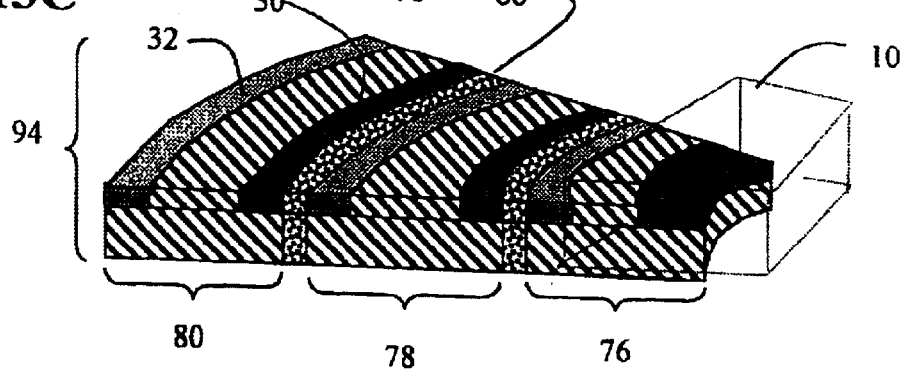

FIGS. 13a through 13c illustrate a multistage (or cascaded, structure including thermoelement couples thermally in series with each other) heat sink/spreader structure 88 wherein each stage 76, 78, 80 comprises an electrical series of thermoelement couples created by bonding a P-type thermoelement 90 with a N-type thermoelement 92 at heat absorbing junctions 30 and heat rejecting junctions 32. The entire structure is contained within at least one thermoelement (semiconductor material) sheet 28.

In one multistage embodiment, the semiconducting thermoelement material may be applied to a dielectric layer prior to the fabrication of the thermoelement couple stages thereby creating a thin, flexible semiconductor material layer (supported by a thin dielectric material) comprising P and N-type thermoelements.

Reference is now made to FIG. 13b (one P-type thermoelement leg isometric section 94 of FIG. 13a on lines 13a—13a) wherein multiple regions (comprising individual stages each with multiple thermoelement couples) within the semiconducting material 28 are doped to yield delineated thermoelement stages 76, 78, 80. Additionally, each thermoelement leg 90, 92, is doped with an alternating P and N-type conductivity dopant thereby creating alternating, yet separate regions of dissimilar conductivity within a single semiconductor substrate 28. It can be seen that each stage 76, 78, 80 contains heat absorbing junctions 30 and heat rejecting junctions 32 and that each successive stage is laterally displaced from the previous stage (positioned outside an entire perimeter of the previous and successive stage) and the heat source region 10.

Another embodiment can be seen in FIG. 13c (one P-type thermoelement leg isometric section 94 of FIG. 13a on lines 13b—13b) wherein a dielectric layer 86, (possibly an oxide or nitride) electrically isolates each thermoelement stage 76, 78, 80 within and between each thermoelement leg 90, 92. In this embodiment, the entire semiconducting thermoelement leg 90, 92 is doped one conductivity type (P or N-type) (without separate regions) and electrically isolated (with the dielectric layer 86) by possibly implanting oxygen between each stage 76, 78, 80. Additionally, the physical regions between each P and N-type thermoelement leg 90, 92 may be removed (chemically or mechanically) in order to maintain electrical insulation between each thermoelement.

An additional multistage heat spreader structure and method of manufacture can be seen in FIGS. 14 through 16c.

Figure 14:
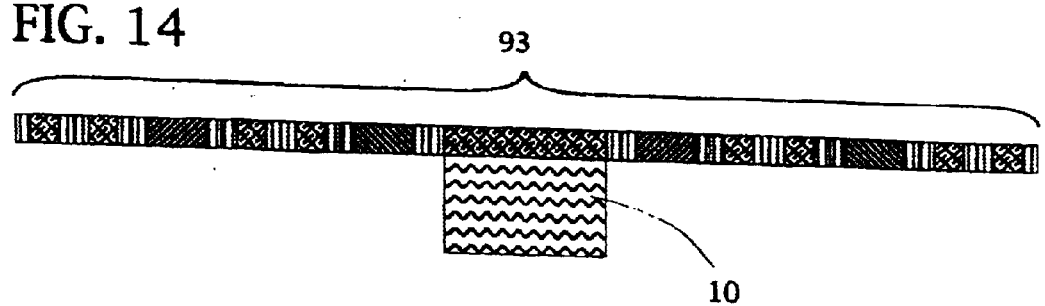
FIG. 14 illustrates another multistage heat sink/spreader structure embodiment attached to a heat source.

FIG. 14 illustrates the multistage heat spreader structure 93 embodiment wherein a heat source 10 is attached to one face of the structure.

Figure 15A:
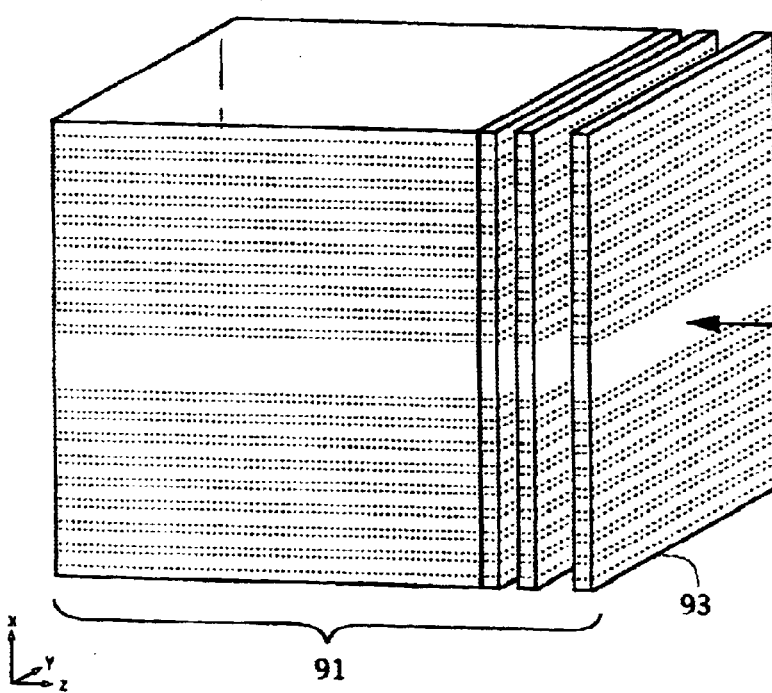
FIGS. 15a and 15b illustrate the stacked layers comprising the multi-staged embodiment seen in FIG. 14.

Within FIG. 15a, a block 91 comprised of multiple layers is sliced (parallel to the stacking plane X) to yield individual multiple heat spreader structures 93 seen in FIG. 14.

Figure 16A:
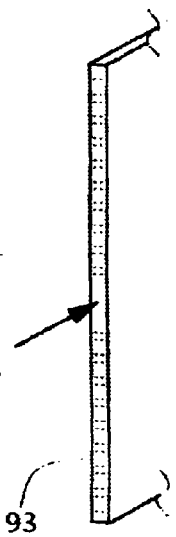

FIG. 16a, illustrates an edge view (face F2) of one structure 93 seen in FIG. 15a.

Figure 15B:
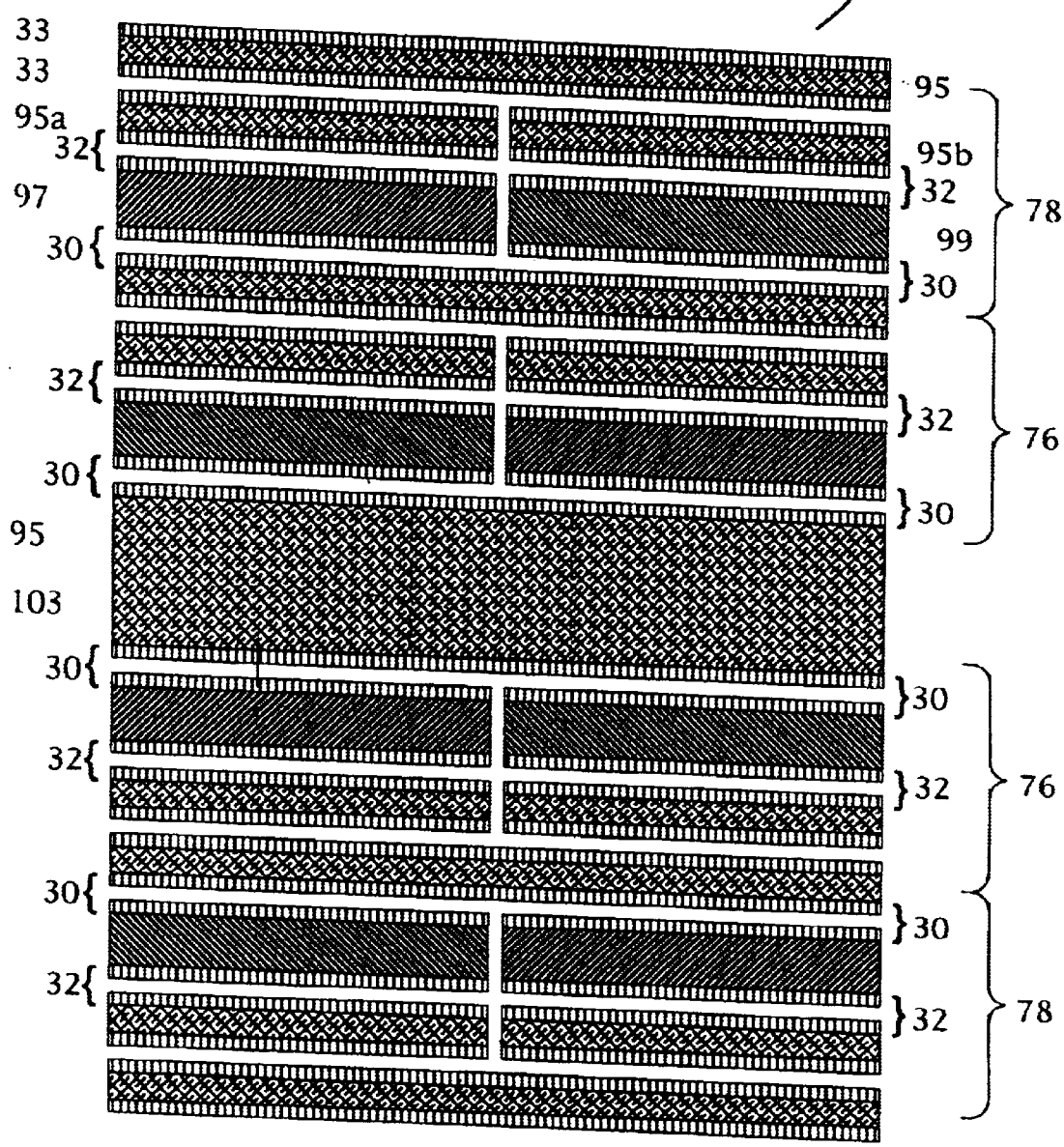

As seen in FIG. 15b (face F1 of FIG. 15a), all individual layers of the multistage heat spreader structure 93 are illustrated. The structure essentially is comprised of multiple thermoelement couple (comprised of two thermoelements 97, 99) stages dielectrically isolated from each other. Each thermoelement couple (comprising each stage 76, 78) consists of a P and N-type thermoelement (two thermoelement materials dissimilar in composition) 97, 99 bonded together at a heat absorbing junction 30 via a conductive layer 33. Each thermoelement 97, 99 also includes a heat rejecting junction 32. A preferable thermoelement material (for both P and N-type thermoelements 97, 99) is doped silicon.

Dielectric isolation (between each thermoelement couple stage 76, 78) is accomplished with dielectric layers 95. Although silicon is considered a semiconductor, its high potential electrical resistivity and thermal conductivity, coupled with the ability to establish metalurgical bonds make it a preferable material for the dielectric layers.

Fabrication of the complete heat spreader structure 93 (seen in FIG. 14) begins with the metallization of the dissimilar thermoelements 97, 99 and dielectric layers 95, all in sheet or layer form. The metallization layers 33 are deposited onto each of the two primary (large) faces of the thermoelements 97, 99 and dielectric layers 95. The thermoelements 97, 99 and dielectric layers 95 are then stacked (via their metallized layers 33 or faces) to yield at least one thermoelement couple (comprised of dissimilar thermoelements 97, 99 with heat absorbing and heat rejecting junctions 30, 32 respectively) per stage 76, 78 with at least one dielectric layer 95 separating each stage 76, 78. It can also be seen that the heat absorbing junctions 30 are located near the center (closest to the heat source region 103) of each thermoelement couple stage 76, 78 and the heat rejecting junctions (of each thermoelement 97, 99) are located near the perimeter of each stage 76, 78.

The dissimilar thermoelements 97, 99 and dielectric layers 95 are all bonded together to form a bonded stack 91 which is then sliced parallel to the stacking plane (plane X) thereby yielding thin heat spreader structures 93. Bonding (via the metallized layers 3) of the individual thermoelement and dielectric layers 97, 99, 95 respectively may be accomplished through soldering, brazing or diffusion bonding. The metallized layers may comprise more than one metal type with differing melting points to facilitate bonding.

It can also be seen in FIG. 15b that the centermost dielectric layer 95 includes a dotted region 103 denoting a location for placement of the heat source (seen in FIG. 14) perpendicular to the heat flow plane (X plane) through each thermoelement couple stage 76, 78. An IC chip (heat source) may be wafer bonded to the region 103 which preferably is comprised of silicon. The bond may be electrically conductive between the chip and spreader structure 95 (via the region 103) thereby creating a ground path for the chip.

Another embodiment seen in FIG. 15b includes two dissimilar dielectric layers 15a, 15b which are positioned immediately adjacent the P and N-type thermoelements 97, 99 respectively. These dielectric layers 95a, 95b may be lightly doped silicon to yield P and N-type dielectric (dielectric relative to the highly conductive thermoelements 97, 99) layers 95a, 95b, resulting in a P and N-type junction between each other. As the stack 91 is assembled and bonded, the P and N-type dielectric layers 95a, 95b will be electrically in parallel with the thermoelements 97, 99. With the application of a voltage across the thermoelements (the correct polarity to induce heat absorption at the heat absorbing junctions of each thermoelement couple via the Peltier Effect) the P and N-type dielectric layers electrically in parallel with each thermoelement couple (comprised of P and N-type thermoelements 97, 99) are reverse-biased. The reverse bias (the application of voltage of the opposite polarity to each P and N-type layer 95a, 95b) acts as a diode, prohibiting current flow through the dielectric layers 95a, 95b. The resultant configuration allows each thermoelement couple stage 76, 78 to be electrically isolated from each other when both primary faces of the dielectric layers 95 possess metallized layers 33.

Although electrical connections to and between the thermoelements' heat rejecting junctions 32 are not shown for clarity, each thermoelement couple may be connected electrically in series or in parallel with each other. Furthermore, each dissimilar thermoelement 97, 99 may be electrically bonded to each other at both the heat absorbing and heat rejecting junctions thereby creating closed electrical circuit thermoelement couples.

FIG. 16b (face F2 of 16a) illustrates the edge view of the structure 93 seen in FIG. 15b. Additionally, FIG. 16c illustrates an exploded view of the structure 93 seen in FIG. 16b.

FIGS. 17 through 20 illustrate various electronic component package types (but not limited to) which may be utilized to house the IC chip (heat source) attachable to the heat sink/spreader structures in any embodiment of the present application. The heat sink/spreader structures illustrated may be attached (via the substrate) with wafer bonding techniques disclosed in the previous figures.

Figure 17:
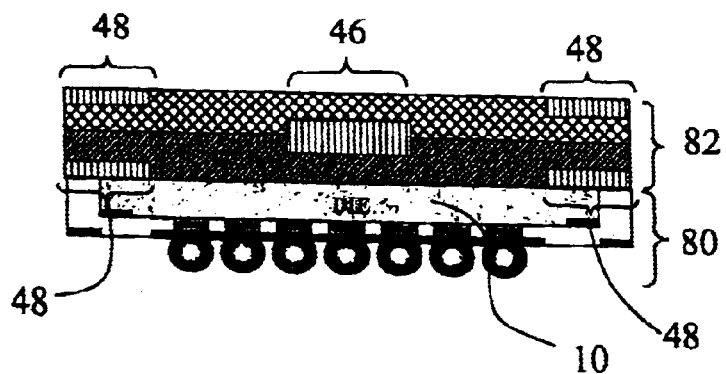
FIG. 17 illustrates a CSP electronic component package for housing the silicon substrate in the present invention.

FIG. 17 illustrates a Chip Scale Package (CSP) 80 including an IC chip 10 attachable to a heat sink/spreader structure 82 of the present invention. The heat absorbing junction 46, positioned near the center of the chip 10 and package 82 transfers heat energy outward to the heat rejecting junction 48 which is located near the perimeter of the die 10 and package 82.

Figure 18:
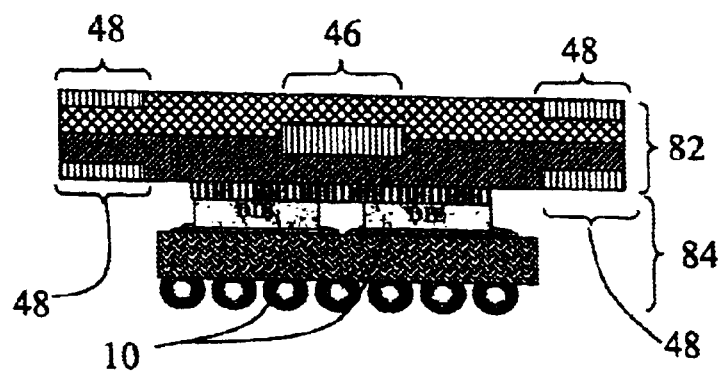
FIG. 18 illustrates a FCMCM electronic component package for housing the silicon substrate in the present invention.

FIG. 18 illustrates a Flip Chip Multi-Chip Module (FCMCM) package 84 wherein two IC chips 10 are attached to a heat sink/spreader structure 82 of the present invention.

Figure 19:
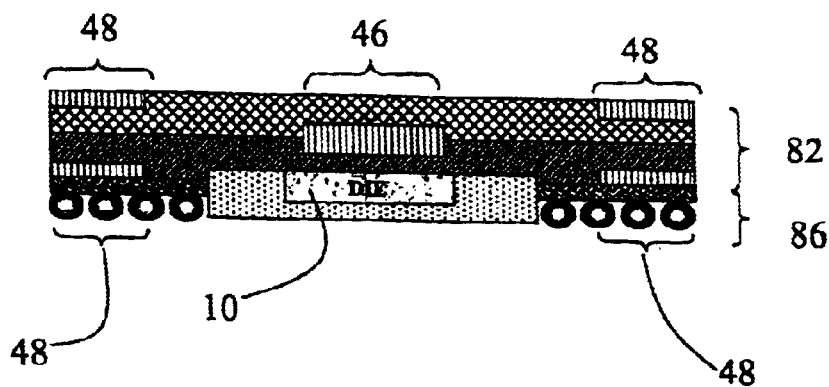
FIG. 19 illustrates a wire-bonded TBGA electronic component package for housing the silicon substrate in the present invention.

FIG. 19 illustrates a wire-bonded Tape Ball Grid Array (TBGA) package 86 in which a heat sink/spreader structure 82 comprises a cavity to which an IC chip 10 is attached.

Figure 20:
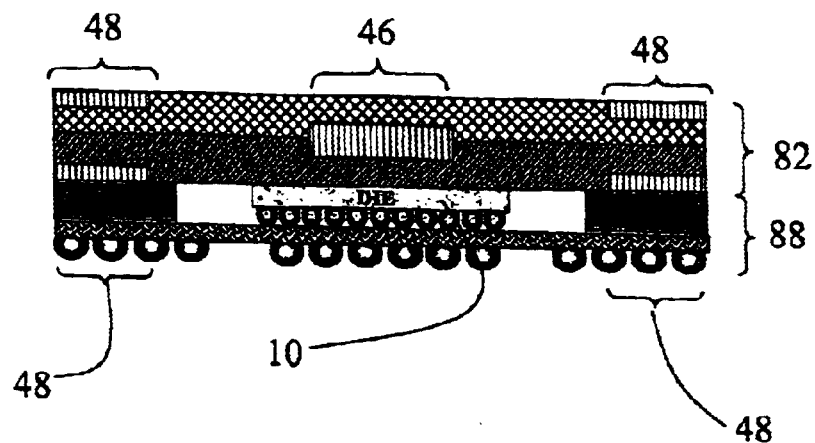
FIG. 20 illustrates a FCBGA electronic component package for housing the silicon substrate in the present invention.

FIG. 20 illustrates a Flip Chip Ball Grid Array (FCBGA) package 88 wherein the heat sink/spreader structure 82 (attachable to the IC chip 10) transfers heat energy from the heat absorbing junction 46 to the heat rejecting junction 48.

Several embodiments of the present invention have been described. A person skilled in the art, however, will recognize that many other embodiments are possible within the scope of the claimed invention. For this reason, the scope of the invention is not to be determined from the description of the embodiments, but must instead be determined solely from the claims that follow.

What is claimed is:

1. A heat sink/spreader structure for dissipating heat from a heat source, the structure comprising:
   at least one electrically conductive heat sink attachable to the heat source; and
   an electrical source connected to the heat sink, whereby the charge carrier flow travels in a direction from the hotter region on the heat sink outward toward the perimeter of the heat sink.

2. The structure in claim 1 wherein the electrically conductive heat sink is attached to the heat source by wafer bonding.

3. The structure in claim 1 wherein the electrically conductive heat sink is electrically in series with an electrical load other than itself.

4. A heat sink/spreader structure including at least one thermoelement couple comprising:
   said thermoelement couple is comprised of at least one semiconductor and at least one dissimilar conductor electrically bonded to the semiconductor thereby creating at least one heat absorbing and more than one heat rejecting junction;
   the heat absorbing junction is positioned near the center of the semiconductor face and the heat rejecting junctions are positioned near the perimeter of the semiconductor face;
   a voltage is applied to the thermoelement couple; and
   said heat sink/spreader structure is attachable to a heat source.

5. The structure in claim 4 wherein the heat absorbing junction may be on the same face of the semiconductor face as the heat rejecting junctions.

6. The structure in claim 4 wherein semiconductor heat rejecting junction is electrically continuous around the perimeter of the semiconductor face.

7. The structure in claim 4 wherein an electric via creates a conductive path from one face of the semiconductor to the other.

8. The structure in claim 4 wherein the heat sink/spreader structure is attached to the heat source by wafer bonding.

9. The structure in claim 4 wherein the semiconductor and dissimilar conductor, comprising each thermoelement couple, is electrically bonded to each other at both the heat absorbing and heat rejecting junctions thereby creating closed electrical circuit thermoelement couples.

10. The structure in claim 4 wherein selected portions of conductive material are applied between the heat absorbing and heat rejecting junctions on at least one face of the semiconductor thereby creating electrically conductive layers electrically in parallel with the semiconductor.

11. The structure in claim 8 wherein the thermoelement couple is electrically in series with an electrical load other than itself.

12. A method of manufacturing a heat sink/spreader structure attachable to a heat source, the structure comprising a sheet of semiconducting thermoelement material, a dielectric material and dissimilar conductive material comprising:
 (a) Creating a pattern of dissimilar conductive material on at least one face of the semiconducting thermoelement material sheet thereby creating at least one thermoelement couple with at least one heat absorbing junction and one heat rejecting junction;
 (b) Applying a dielectric material to the exposed areas of each semiconducting material sheet face and to at least a portion of the exposed heat rejecting junction;
 (c) Applying dissimilar conductive material to the dielectric material and heat absorbing junction surfaces.

13. The method of claim 12 wherein the heat absorbing junction is positioned near the center of the semiconducting material face and the heat rejecting junctions are positioned near the perimeter of the semiconducting material face.

14. The method of claim 12 wherein the semiconducting material heat rejecting junction is electrically continuous around the perimeter of the semiconducting material face.

15. The method of claim 12 wherein the semiconducting thermoelement material is applied to a dielectric Layer prior to step (a).

16. The method of claim 12 wherein selected portions of conductive material are applied between the heat absorbing and heat rejecting junctions on at least one face of the semiconducting thermoelement material thereby creating electrically conductive layers electrically in parallel with the semiconducting thermoelement material.

17. The method of claim 12, wherein the heat source is at least one electronic component.

18. The method of in claim 12, further comprising a package for housing the electronic component.

19. The method of claim 12 wherein the heat sink/spreader structure is attached to the heat source by wafer bonding.

20. The method of claim 12 wherein the heat source attachment to the heat sink/spreader structure is electrically conductive.

21. The method of claim 12 wherein the semiconducting thermoelement material is a selected one of: silicon, carbon, silicon carbide, gallium arsenide or electrically conductive polymers.

22. A method of manufacturing a heat sink/spreader structure attachable to a heat source, the structure comprising a sheet of semiconducting thermoelement material, an oxide layer and dissimilar conductive material comprising:
 (a) Oxidizing at least one face of the semiconducting thermoelement material sheet;
 (b) Masking a select portion of the sheet;
 (c) Removing the oxide from a select portion of the sheet;
 (d) Bonding dissimilar conductive material to the exposed portions of the semiconducting thermoelement sheet, thereby creating at least one thermoelement and at least one heat absorbing junction and one heat rejecting junction.

23. The method of claim 22 wherein at a heat absorbing junction is created on one face of the semiconducting thermoelement sheet and a heat rejecting junction is created on the opposite face.

24. The method of claim 22 wherein the heat absorbing junction is positioned near the center of the semiconducting material face and the heat rejecting junction is positioned near the perimeter of the semiconducting material face.

25. The method of claim 22 wherein the dissimilar conductive material is applied to the remaining oxide and junction surfaces on at least one face of the semiconducting thermoelement sheet.

26. The method of claim 22 wherein the oxide layer may be any dielectric layer.

27. The method of claim 22 wherein an electric potential is applied to the heat absorbing junction and heat rejecting junction.

28. The method of claim 22 wherein the semiconducting thermoelement material is applied to a dielectric layer prior to step (a).

29. The method of claim 22 wherein selected portions of conductive material are applied between the heat absorbing and heat rejecting junctions on at least one face of the semiconducting thermoelement material thereby creating electrically conductive layers electrically in parallel with each thermoelement.

30. The method of claim 22 wherein the heat source is at least one electronic component.

31. The method of claim 22, further comprising a package for housing the electronic component.

32. The method of claim 22 wherein the heat sink/spreader structure is attached to the heat source by wafer bonding.

33. The method of claim 22 wherein the heat source attachment to the heat sink/spreader structure is electrically conductive.

34. The method of claim 22 wherein the semiconducting thermoelement material is a selected one of:
 silicon, carbon, silicon carbide, gallium arsenide or electrically; conductive polymers.

35. A method of manufacturing a heat sink/spreader structure attachable to a heat source comprising more than one thermoelement couple, each with at least one heat absorbing and one heat rejecting junction, P-type and negative-type N-type conductivity dopants and a semiconducting material comprising the steps of:
 (a) Selectively depositing the P and N-type dopants into at least one face of the semiconducting material to form a pattern of P and N-type conductivity thermoelements;
 (b) Electrically bonding the P and N-type conductivity thermoelements at heat absorbing and heat rejecting junctions to form thermoelement couples wherein the heat absorbing junctions are located near the center of the semiconductor material and the heat rejecting junctions are located near the perimeter of the semiconductor.

36. The method of claim 35 wherein a dielectric, such as oxide or nitride, is added to the physical regions between each P and N-type thermoelement in order to provide electrical insulation between each thermoelement.

37. The method of claim 35 wherein the physical regions between each P and N-type thermoelement are removed in order to provide electrical insulation between each thermoelement.

38. The method of claim 35 wherein a voltage is applied to at least one thermoelement couple.

39. The method of claim 35 wherein the semiconducting thermoelement material is applied to a dielectric layer prior to step (a).

40. The method of claim 35 wherein the thermoelement couple is electrically in series with an electrical load other than itself, such as an integrated circuit or other electronic component.

41. The method of claim 35 wherein the thermoelement couple is utilized as a resistive load for an electronic component.

42. The method of claim 35 wherein a voltage and current is generated by at least one thermoelement couple and is consumed by an external electric load.

43. The method of claim 35 wherein each thermoelement couple is electrically bonded to itself at both the heat absorbing and heat rejecting junctions thereby creating closed electrical circuit thermoelement couples.

44. The method of claim 35 wherein selected portions of conductive material are applied between the heat absorbing and heat rejecting junctions on at least one face of the semiconducting thermoelement material thereby creating electrically conductive layers electrically in parallel with each thermoelement.

45. The method of claim 35 wherein the heat source is at least one electronic component.

46. The method of claim 35, further comprising a package for housing the electronic component.

47. The method of claim 35 wherein the heat sink/spreader structure is attached to the heat source by wafer bonding.

48. The method of claim 35 wherein the heat source attachment to the heat sink/spreader structure is electrically conductive.

49. The method of claim 35 wherein the semiconducting material is a selected one of: silicon, carbon, silicon carbide, gallium arsenide or electrically conductive polymers.

50. A heat sink/spreader structure comprising:
   a semiconducting material sheet, including more than one thermoelement couple stage, each stage comprising at least one thermoelement couple, each with at least one heat absorbing and heat rejecting junction, wherein each heat absorbing junction is positioned near the center of each thermoelement couple stage and heat rejecting junction is positioned near the perimeter of each stage and all thermoelement couple stages are fabricated within at least one semiconducting material sheet; and
   said heat sink/spreader structure is attachable to a heat source.

51. The structure in claim 50 wherein each stage is positioned outside the entire perimeter of a previous stage.

52. The structure in claim 50 wherein a dielectric, such as oxide or nitride, is added to the physical regions between each thermoelement stage in order to provide electrical insulation between each thermoelement.

53. The structure in claim 50 wherein the physical regions between each thermoelement stage are removed in order to provide electrical insulation between each thermoelement.

54. The structure in claim 50 wherein the thermoelement couple is electrically in series with an electrical load other than itself.

55. The structure in claim 50 wherein each dissimilar thermoelement, comprising each thermoelement couple, is electrically bonded to each other at both the heat absorbing and heat rejecting junctions thereby creating closed electrical circuit thermoelement couples.

56. The structure in claim 50 wherein selected portions of conductive material are applied between the heat absorbing and heat rejecting junctions on at least one face of the semiconducting thermoelement material thereby creating electrically conductive layers electrically in parallel with each thermoelement.

57. The structure in claim 50 wherein the heat sink/spreader structure is attached to the heat source by wafer bonding.

58. A method of manufacturing a multistage heat sink/spreader structure attachable to a heat source comprising more than one thermoelement couple stage, each stage including at least one thermoelement couple, each thermoelement couple including two dissimilar thermoelements and at least one heat absorbing and heat rejecting junction and more than one dielectric layer comprising the steps of:
   (a) Metallizing each face of both dissimilar thermoelements and the dielectric layers;
   (b) Stacking the metallized dissimilar thermoelements and dielectric layers via their metallized faces;
   (c) Bonding the dissimilar thermoelements and dielectric layers together to form a bonded stack;
   (d) Slicing the bonded stack parallel to the stacking plane thereby creating at least one slice comprising a multistage heat sink/spreader structure;
   (e) Attaching a heat source perpendicular to the heat flow plane through each thermoelement couple stage.

59. The method of claim 58 wherein the thermoelements are comprised of silicon.

60. The method of claim 58 wherein the dielectric layers are comprised of silicon.

61. The method of claim 58 wherein the bonding in step (c) is a selected one of: soldering, brazing or diffusion bonding.

62. The method of claim 58 wherein the heat source is at least one electronic component.

63. The method of claim 58, further comprising a package for housing the electronic component.

64. The method of claim 58 wherein the heat sink/spreader structure is attached to the heat source by wafer bonding.

65. The method of claim 58 wherein the heat source attachment to the heat sink/spreader structure is electrically conductive.

66. The method of claim 58 wherein each heat absorbing junction is positioned near the center of each thermoelement couple stage and heat rejecting junction is positioned near the perimeter of each stage.

67. The method of claim 58 wherein each dissimilar thermoelement, comprising each thermoelement couple, is electrically bonded to each other at both the heat absorbing and heat rejecting junctions thereby creating closed electrical circuit thermoelement couples.

68. The method of claim 58 wherein the thermoelement couple is electrically in series with an electrical load other than itself.

69. The method of claim 58 wherein the thermoelement couple is utilized as a resistive load for an electronic component.

70. The method of claim 58 wherein a voltage and current is generated by at least one thermoelement couple and is consumed by an external electric load.

71. The method of claim 58 wherein a reverse biased P and N-type junction is electrically in parallel with at least one thermoelement couple.

* * * * *